(12) United States Patent
Martin et al.

(10) Patent No.: US 7,771,821 B2
(45) Date of Patent: Aug. 10, 2010

(54) LOW-FRICTION SLIDING MEMBER AND LOW-FRICTION SLIDING MECHANISM USING SAME

(75) Inventors: Jean Michel Martin, Chazay d'Azergues (FR); Saihei Kano, Yokohama (JP); Makoto Kano, Yokohama (JP); Yoshiteru Yasuda, Yokohama (JP); Yusuke Okamoto, Kanagawa (JP); Yutaka Mabuchi, Yokohama (JP); Takafumi Ueno, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 95 days.

(21) Appl. No.: 10/911,744

(22) Filed: Aug. 5, 2004

(65) Prior Publication Data
US 2005/0064196 A1 Mar. 24, 2005

(30) Foreign Application Priority Data
Aug. 21, 2003 (JP) ............................. 2003-208278

(51) Int. Cl.
*B32B 9/00* (2006.01)
(52) U.S. Cl. ...................................... 428/408
(58) Field of Classification Search ................ 428/408; 977/742; 423/445 R
See application file for complete search history.

(56) References Cited

U.S. PATENT DOCUMENTS

| 1,461 | A | 12/1839 | Day |
| 2,270,101 | A * | 1/1942 | Ballard ........................ 508/179 |
| 2,716,972 | A | 9/1955 | Famy et al. |
| 2,982,733 | A | 5/1961 | Wright et al. |
| 3,211,647 | A | 10/1965 | O'Halloran et al. |
| 3,790,315 | A | 2/1974 | Emanuelsson et al. |
| 3,846,162 | A | 11/1974 | Bloom |
| 3,932,228 | A | 1/1976 | Sugiyama et al. |
| 4,031,023 | A | 6/1977 | Musser et al. |
| 4,367,130 | A | 1/1983 | Lemelson |
| 4,385,880 | A | 5/1983 | Lemelson |
| 4,504,519 | A * | 3/1985 | Zelez ......................... 427/577 |
| 4,538,929 | A | 9/1985 | Ehrentraut et al. |

(Continued)

FOREIGN PATENT DOCUMENTS

CA 2009582 8/1990

(Continued)

OTHER PUBLICATIONS

Gåhlin, Rickard et al., "ME-C:H Coatings in Motor Vehicles," *WEAR* 249, 2001, pp. 302-309.

(Continued)

*Primary Examiner*—David R Sample
*Assistant Examiner*—Daniel Miller
(74) *Attorney, Agent, or Firm*—Foley & Lardner LLP

(57) ABSTRACT

A low-friction sliding member such as a piston, a piston ring, a piston skirt section and a cylinder liner section of an internal combustion engine. The low-friction sliding member includes a base material having a surface. A hard carbon thin film is formed at at least a part of the surface of the base material. Here, a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound.

15 Claims, 1 Drawing Sheet

U.S. PATENT DOCUMENTS

| | | |
|---|---|---|
| 4,554,208 A | 11/1985 | MacIver et al. |
| 4,645,610 A | 2/1987 | Born et al. |
| 4,702,808 A | 10/1987 | Lemelson |
| 4,712,982 A | 12/1987 | Inagaki et al. |
| 4,755,237 A | 7/1988 | Lemelson |
| 4,755,426 A | 7/1988 | Kokai et al. |
| 4,783,368 A | 11/1988 | Yamamoto et al. |
| 4,834,400 A | 5/1989 | Lebeck |
| 4,842,755 A | 6/1989 | Dunn |
| 4,859,493 A | 8/1989 | Lemelson |
| 4,874,596 A | 10/1989 | Lemelson |
| 4,919,974 A | 4/1990 | McCune et al. |
| 4,933,058 A | 6/1990 | Bache et al. |
| 4,943,345 A | 7/1990 | Asmussen et al. |
| 4,960,643 A | 10/1990 | Lemelson |
| 4,974,498 A | 12/1990 | Lemelson |
| 4,980,021 A | 12/1990 | Kitamura et al. |
| 4,980,610 A | 12/1990 | Varga |
| 4,981,717 A | 1/1991 | Thaler |
| 4,988,421 A | 1/1991 | Drawl et al. |
| 4,992,082 A | 2/1991 | Drawl et al. |
| 5,000,541 A | 3/1991 | DiMarcello et al. |
| 5,021,628 A | 6/1991 | Lemelson |
| 5,032,243 A | 7/1991 | Bache et al. |
| 5,036,211 A | 7/1991 | Scott |
| 5,040,501 A | 8/1991 | Lemelson |
| 5,067,826 A | 11/1991 | Lemelson |
| 5,077,990 A | 1/1992 | Plath |
| 5,078,848 A | 1/1992 | Anttila et al. |
| 5,087,608 A | 2/1992 | Chan et al. |
| 5,096,352 A | 3/1992 | Lemelson |
| 5,110,435 A | 5/1992 | Haberland |
| 5,112,025 A | 5/1992 | Nakayama et al. |
| 5,127,314 A | 7/1992 | Swain |
| 5,131,941 A | 7/1992 | Lemelson |
| 5,132,587 A | 7/1992 | Lemelson |
| 5,142,785 A | 9/1992 | Grewal et al. |
| 5,143,634 A | 9/1992 | Quinga et al. |
| 5,148,780 A | 9/1992 | Urano et al. |
| 5,187,021 A | 2/1993 | Vydra et al. |
| 5,190,807 A | 3/1993 | Kimock et al. |
| 5,190,824 A | 3/1993 | Itoh |
| 5,202,156 A | 4/1993 | Yamamoto et al. |
| 5,205,188 A | 4/1993 | Repenning et al. |
| 5,205,305 A | 4/1993 | Yamakita |
| H1210 H | 7/1993 | Jansen |
| 5,232,568 A | 8/1993 | Parent et al. |
| 5,237,967 A | 8/1993 | Willermet et al. |
| 5,249,554 A | 10/1993 | Tamor et al. |
| 5,255,783 A | 10/1993 | Goodman et al. |
| 5,255,929 A | 10/1993 | Lemelson |
| 5,284,394 A | 2/1994 | Lemelson |
| 5,288,556 A | 2/1994 | Lemelson |
| 5,295,305 A | 3/1994 | Hahn et al. |
| 5,299,937 A | 4/1994 | Gow |
| 5,317,938 A | 6/1994 | de Juan, Jr. et al. |
| 5,326,488 A | 7/1994 | Minokami et al. |
| 5,332,348 A | 7/1994 | Lemelson |
| 5,334,306 A | 8/1994 | Dautremont-Smith et al. |
| 5,349,265 A | 9/1994 | Lemelson |
| 5,358,402 A | 10/1994 | Reed et al. |
| 5,359,170 A | 10/1994 | Chen et al. |
| 5,360,227 A | 11/1994 | Lemelson |
| 5,380,196 A | 1/1995 | Kelly et al. |
| 5,401,543 A | 3/1995 | O'Neill et al. |
| H1461 H | 7/1995 | DiVita et al. |
| 5,432,539 A | 7/1995 | Anderson |
| 5,433,977 A | 7/1995 | Sarin et al. |
| H1471 H | 8/1995 | Braun et al. |
| 5,443,032 A | 8/1995 | Vichr et al. |
| 5,447,208 A | 9/1995 | Lund et al. |
| 5,456,406 A | 10/1995 | Lemelson |
| 5,458,754 A | 10/1995 | Sathrum et al. |
| 5,461,648 A | 10/1995 | Nauflett et al. |
| 5,462,772 A | 10/1995 | Lemelson |
| 5,464,667 A | 11/1995 | Köhler et al. |
| 5,466,431 A | 11/1995 | Dorfman et al. |
| 5,479,069 A | 12/1995 | Winsor |
| 5,482,602 A | 1/1996 | Cooper et al. |
| 5,491,028 A | 2/1996 | Sarin et al. |
| 5,497,550 A | 3/1996 | Trotta et al. |
| 5,509,841 A | 4/1996 | Winsor |
| 5,516,729 A | 5/1996 | Dawson et al. |
| 5,529,815 A | 6/1996 | Lemelson |
| 5,531,878 A | 7/1996 | Vadgama et al. |
| 5,541,566 A | 7/1996 | Deeney |
| 5,547,716 A | 8/1996 | Thaler |
| 5,551,959 A | 9/1996 | Martin et al. |
| 5,552,675 A | 9/1996 | Lemelson |
| 5,568,391 A | 10/1996 | Mckee |
| 5,593,719 A | 1/1997 | Dearnaley et al. |
| 5,616,372 A | 4/1997 | Conley et al. |
| 5,619,889 A | 4/1997 | Jones et al. |
| 5,628,881 A | 5/1997 | Lemelson |
| 5,630,275 A | 5/1997 | Wexler |
| 5,630,953 A | 5/1997 | Klink |
| 5,653,300 A | 8/1997 | Lund et al. |
| 5,669,144 A | 9/1997 | Hahn et al. |
| 5,672,054 A | 9/1997 | Cooper et al. |
| 5,688,557 A | 11/1997 | Lemelson et al. |
| 5,707,409 A | 1/1998 | Martin et al. |
| 5,714,202 A | 2/1998 | Lemelson et al. |
| 5,719,109 A | 2/1998 | Tokashiki et al. |
| 5,723,207 A | 3/1998 | Lettington et al. |
| 5,731,046 A | 3/1998 | Mistry et al. |
| 5,735,769 A | 4/1998 | Takemura et al. |
| 5,740,941 A | 4/1998 | Lemelson |
| 5,775,817 A | 7/1998 | Gottemoller et al. |
| 5,786,038 A | 7/1998 | Conley et al. |
| 5,790,146 A | 8/1998 | Anderson |
| 5,793,390 A | 8/1998 | Claflin et al. |
| 5,794,801 A | 8/1998 | Lemelson |
| 5,799,549 A | 9/1998 | Decker et al. |
| 5,806,557 A | 9/1998 | Helge |
| 5,824,387 A | 10/1998 | Boutaghou et al. |
| 5,834,708 A | 11/1998 | Svetal et al. |
| 5,840,662 A | 11/1998 | Nibert et al. |
| 5,843,571 A | 12/1998 | Sho |
| 5,851,962 A | 12/1998 | Kaga |
| 5,866,195 A | 2/1999 | Lemelson |
| 5,871,805 A | 2/1999 | Lemelson |
| 5,881,444 A | 3/1999 | Schaefer et al. |
| 5,901,021 A | 5/1999 | Hirano et al. |
| 5,910,940 A | 6/1999 | Guerra |
| 5,927,897 A | 7/1999 | Attar |
| 5,937,812 A | 8/1999 | Reedy et al. |
| 5,940,975 A | 8/1999 | Decker et al. |
| 5,945,214 A | 8/1999 | Ma et al. |
| 5,947,710 A | 9/1999 | Cooper et al. |
| 5,952,102 A | 9/1999 | Cutler |
| 5,958,261 A | 9/1999 | Offer et al. |
| 5,960,762 A | 10/1999 | Imai |
| 5,967,250 A | 10/1999 | Lund et al. |
| 5,968,596 A | 10/1999 | Ma et al. |
| 5,975,686 A | 11/1999 | Hauck et al. |
| 5,976,707 A | 11/1999 | Grab |
| 5,992,268 A | 11/1999 | Decker et al. |
| 5,993,938 A | 11/1999 | Tsukuda et al. |
| 6,006,415 A | 12/1999 | Schaefer et al. |
| 6,015,597 A | 1/2000 | David |
| 6,016,000 A | 1/2000 | Moslehi |
| 6,023,979 A | 2/2000 | Bills et al. |
| 6,028,393 A | 2/2000 | Izu et al. |
| 6,051,298 A | 4/2000 | Ko et al. |

| Patent No. | Date | Inventor |
|---|---|---|
| 6,056,443 A | 5/2000 | Koike et al. |
| 6,059,460 A | 5/2000 | Ono et al. |
| 6,059,830 A | 5/2000 | Lippincott, III et al. |
| 6,071,597 A | 6/2000 | Yang et al. |
| 6,083,313 A | 7/2000 | Venkatraman et al. |
| 6,083,570 A | 7/2000 | Lemelson et al. |
| 6,095,690 A | 8/2000 | Niegel et al. |
| 6,099,541 A | 8/2000 | Klopotek |
| 6,099,976 A | 8/2000 | Lemelson et al. |
| 6,106,919 A | 8/2000 | Lee et al. |
| 6,124,198 A | 9/2000 | Moslehi |
| 6,139,964 A | 10/2000 | Sathrum et al. |
| 6,142,481 A | 11/2000 | Iwashita et al. |
| 6,145,608 A | 11/2000 | Lund et al. |
| 6,156,439 A | 12/2000 | Coffinberry |
| 6,159,558 A | 12/2000 | Wolfe et al. |
| 6,160,683 A | 12/2000 | Boutaghou |
| 6,165,616 A | 12/2000 | Lemelson et al. |
| 6,170,156 B1 | 1/2001 | Lev et al. |
| 6,171,343 B1 | 1/2001 | Dearnaley et al. |
| 6,173,913 B1 | 1/2001 | Shafer et al. |
| 6,190,514 B1 | 2/2001 | Ma et al. |
| 6,193,906 B1 | 2/2001 | Kaneko et al. |
| 6,197,120 B1 | 3/2001 | David |
| 6,197,428 B1 | 3/2001 | Rogers |
| 6,203,651 B1 | 3/2001 | Järvenkylä et al. |
| 6,205,291 B1 | 3/2001 | Hughes et al. |
| 6,207,625 B1 | 3/2001 | Ogano et al. |
| 6,227,056 B1 | 5/2001 | Bills et al. |
| 6,237,441 B1 | 5/2001 | Nishioka et al. |
| 6,237,852 B1 | 5/2001 | Svetal et al. |
| 6,238,839 B1 | 5/2001 | Tomita et al. |
| 6,255,262 B1 | 7/2001 | Keenan et al. |
| 6,261,424 B1 | 7/2001 | Goncharenko et al. |
| 6,273,793 B1 | 8/2001 | Liners et al. |
| 6,274,220 B1 | 8/2001 | Tsukuda et al. |
| 6,289,593 B1 | 9/2001 | Decker et al. |
| 6,293,648 B1 | 9/2001 | Anderson |
| 6,296,552 B1 | 10/2001 | Boutaghou et al. |
| 6,299,425 B1 | 10/2001 | Hirano et al. |
| 6,305,416 B1 | 10/2001 | Snel et al. |
| 6,309,283 B1 | 10/2001 | Liners et al. |
| 6,311,524 B1 | 11/2001 | Brennan, III et al. |
| 6,316,734 B1 | 11/2001 | Yang |
| 6,322,431 B1 | 11/2001 | Schaenzer et al. |
| 6,322,719 B2 | 11/2001 | Kaneko et al. |
| 6,324,060 B1 | 11/2001 | Hsu |
| 6,325,385 B1 | 12/2001 | Iwashita et al. |
| 6,329,328 B1 | 12/2001 | Koganei et al. |
| 6,333,298 B1 | 12/2001 | Waddoups et al. |
| 6,338,881 B1 | 1/2002 | Sellschopp et al. |
| 6,340,245 B1 | 1/2002 | Horton et al. |
| 6,358,123 B1 | 3/2002 | Liners et al. |
| 6,367,705 B1 | 4/2002 | Lee et al. |
| 6,368,676 B1 | 4/2002 | Gaudreau et al. |
| 6,377,422 B1 | 4/2002 | Boutaghou et al. |
| 6,379,383 B1 | 4/2002 | Palmaz et al. |
| 6,385,987 B2 | 5/2002 | Schlom et al. |
| 6,386,468 B1 | 5/2002 | Neuberger et al. |
| 6,399,215 B1 | 6/2002 | Zhu et al. |
| 6,401,058 B1 | 6/2002 | Akalin et al. |
| 6,439,845 B1 | 8/2002 | Veres |
| 6,439,986 B1 | 8/2002 | Myoung et al. |
| 6,452,752 B1 | 9/2002 | Boutaghou |
| 6,468,642 B1 | 10/2002 | Bray et al. |
| 6,471,979 B2 | 10/2002 | New et al. |
| 6,494,881 B1 | 12/2002 | Bales et al. |
| 6,508,416 B1 * | 1/2003 | Mastro et al. ............ 239/585.1 |
| 6,523,456 B1 | 2/2003 | Kobayashi et al. |
| 6,524,212 B2 | 2/2003 | Ushijima et al. |
| 6,534,141 B1 | 3/2003 | Hull, Jr. et al. |
| 6,537,310 B1 | 3/2003 | Palmaz et al. |
| 6,537,429 B2 | 3/2003 | O'Donnell et al. |
| 6,543,394 B2 | 4/2003 | Tinney |
| 6,544,308 B2 | 4/2003 | Griffin et al. |
| 6,553,957 B1 | 4/2003 | Ishikawa et al. |
| 6,557,968 B2 | 5/2003 | Lee et al. |
| 6,562,445 B2 | 5/2003 | Iwamura |
| 6,562,462 B2 | 5/2003 | Griffin et al. |
| 6,570,172 B2 | 5/2003 | Kim et al. |
| 6,572,651 B1 | 6/2003 | DeScheerder et al. |
| 6,572,935 B1 | 6/2003 | He et al. |
| 6,572,937 B2 | 6/2003 | Hakovirta et al. |
| 6,585,064 B2 | 7/2003 | Griffin et al. |
| 6,586,069 B2 | 7/2003 | Dykes et al. |
| 6,589,640 B2 | 7/2003 | Griffin et al. |
| 6,592,519 B1 | 7/2003 | Martinez |
| 6,592,985 B2 | 7/2003 | Griffin et al. |
| 6,592,993 B2 * | 7/2003 | Veerasamy ............... 428/408 |
| 6,601,662 B2 | 8/2003 | Matthias et al. |
| 6,626,949 B1 | 9/2003 | Townley |
| 6,629,906 B1 | 10/2003 | Chiba et al. |
| 6,637,528 B2 | 10/2003 | Nishiyama et al. |
| 6,638,569 B2 | 10/2003 | McLaughlin et al. |
| 6,645,354 B1 | 11/2003 | Gorokhovsky |
| 6,656,329 B1 | 12/2003 | Ma et al. |
| 6,658,941 B1 | 12/2003 | Bills et al. |
| 6,666,328 B2 | 12/2003 | Sykora |
| 6,666,671 B1 | 12/2003 | Olver et al. |
| 6,684,513 B1 | 2/2004 | Clipstone et al. |
| 6,684,759 B1 | 2/2004 | Gorokhovsky |
| 6,695,865 B2 | 2/2004 | Boyle et al. |
| 6,699,106 B2 | 3/2004 | Myoung et al. |
| 6,701,627 B2 | 3/2004 | Korb et al. |
| 6,715,693 B1 | 4/2004 | Dam et al. |
| 6,726,993 B2 | 4/2004 | Teer et al. |
| 6,729,350 B2 | 5/2004 | Schick |
| 6,729,527 B2 | 5/2004 | Sonnenreich et al. |
| 6,733,513 B2 | 5/2004 | Boyle et al. |
| 6,739,214 B2 | 5/2004 | Griffin et al. |
| 6,739,238 B2 | 5/2004 | Ushijima et al. |
| 6,740,393 B1 | 5/2004 | Massler et al. |
| 6,745,742 B2 | 6/2004 | Meyer |
| 6,749,033 B2 | 6/2004 | Griffin et al. |
| 6,753,042 B1 | 6/2004 | Bakounine et al. |
| 6,753,635 B2 | 6/2004 | Kuhlmann-Wilsdorf |
| 6,761,532 B2 | 7/2004 | Capone et al. |
| 6,761,736 B1 | 7/2004 | Woo et al. |
| 6,780,177 B2 | 8/2004 | Shafirstein et al. |
| 6,797,326 B2 | 9/2004 | Griffin et al. |
| 6,799,468 B2 | 10/2004 | Borenstein |
| 6,806,242 B2 | 10/2004 | Shirahama et al. |
| 6,818,029 B2 | 11/2004 | Myoung et al. |
| 6,820,676 B2 | 11/2004 | Palmaz et al. |
| 6,821,189 B1 | 11/2004 | Coad et al. |
| 6,821,624 B2 | 11/2004 | Utsumi et al. |
| 6,822,788 B2 | 11/2004 | Blitstein |
| 6,849,085 B2 | 2/2005 | Marton |
| 6,855,237 B2 | 2/2005 | Kolpakov et al. |
| 6,855,791 B2 | 2/2005 | Van Doren et al. |
| 6,861,098 B2 | 3/2005 | Griffin et al. |
| 6,861,137 B2 | 3/2005 | Griffin et al. |
| 6,865,952 B2 | 3/2005 | Bills et al. |
| 6,866,894 B2 | 3/2005 | Trankiem et al. |
| 6,871,700 B2 | 3/2005 | Gorokhovsky |
| 6,872,203 B2 | 3/2005 | Shafirstein et al. |
| 6,878,447 B2 | 4/2005 | Griffin et al. |
| 6,880,469 B2 | 4/2005 | Frost |
| 6,882,094 B2 | 4/2005 | Dimitrijevic et al. |
| 6,883,476 B1 | 4/2005 | Nohara et al. |
| 6,885,521 B2 | 4/2005 | Kikuchi |
| 6,886,521 B2 | 5/2005 | Hamada et al. |
| 6,887,585 B2 | 5/2005 | Herbst-Dederichs |
| 6,890,700 B2 | 5/2005 | Tomita et al. |
| 6,893,720 B1 | 5/2005 | Nakahigashi et al. |
| 6,969,198 B2 | 11/2005 | Konishi et al. |

| | | | |
|---|---|---|---|
| 2001/0036800 A1 | 11/2001 | Liners et al. | |
| 2002/0026899 A1 | 3/2002 | McLaughlin et al. | |
| 2002/0031987 A1 | 3/2002 | Liners et al. | |
| 2002/0034631 A1 | 3/2002 | Griffin et al. | |
| 2002/0034632 A1 | 3/2002 | Griffin et al. | |
| 2002/0051286 A1 | 5/2002 | Blitstein | |
| 2002/0070357 A1 | 6/2002 | Kim et al. | |
| 2002/0074168 A1 | 6/2002 | Matthias et al. | |
| 2002/0089571 A1 | 7/2002 | Lee et al. | |
| 2002/0090155 A1 | 7/2002 | Ushijima et al. | |
| 2002/0090578 A1 | 7/2002 | Schaefera et al. | |
| 2002/0130219 A1 | 9/2002 | Parseghian et al. | |
| 2002/0148430 A1 | 10/2002 | Kano et al. | |
| 2002/0155015 A1 | 10/2002 | Esumi et al. | |
| 2002/0175476 A1 | 11/2002 | Chinou et al. | |
| 2003/0012234 A1 | 1/2003 | Watson et al. | |
| 2003/0019111 A1 | 1/2003 | Korb et al. | |
| 2003/0019332 A1 | 1/2003 | Korb et al. | |
| 2003/0021995 A1 | 1/2003 | Griffin et al. | |
| 2003/0034182 A1 | 2/2003 | Griffin et al. | |
| 2003/0035957 A1 | 2/2003 | Griffin et al. | |
| 2003/0035958 A1 | 2/2003 | Griffin et al. | |
| 2003/0036341 A1 | 2/2003 | Myoung et al. | |
| 2003/0037640 A1 | 2/2003 | Griffin et al. | |
| 2003/0069632 A1 | 4/2003 | De Scheerder et al. | |
| 2003/0108777 A1 | 6/2003 | Gunsel et al. | |
| 2003/0114094 A1 | 6/2003 | Myoung et al. | |
| 2003/0128903 A1 | 7/2003 | Yasuda et al. | |
| 2003/0159919 A1 | 8/2003 | Fairbairn et al. | |
| 2003/0162672 A1 | 8/2003 | Shirahama et al. | |
| 2003/0168323 A1 | 9/2003 | Frost | |
| 2003/0180565 A1 | 9/2003 | Herbst-Dederichs | |
| 2003/0199741 A1 | 10/2003 | Martinez | |
| 2003/0234371 A1 | 12/2003 | Ziegler | |
| 2003/0235691 A1 | 12/2003 | Griffin et al. | |
| 2004/0003638 A1 | 1/2004 | Schaefer et al. | |
| 2004/0008406 A1 | 1/2004 | Blitstein | |
| 2004/0010068 A1 | 1/2004 | Doren et al. | |
| 2004/0011900 A1 | 1/2004 | Gebhardt et al. | |
| 2004/0027018 A1 | 2/2004 | LeBlanc et al. | |
| 2004/0035375 A1 | 2/2004 | Gibisch et al. | |
| 2004/0074467 A1 | 4/2004 | Hamada et al. | |
| 2004/0092405 A1 | 5/2004 | Konishi et al. | |
| 2004/0105806 A1 | 6/2004 | Griffin et al. | |
| 2004/0109621 A1 | 6/2004 | Frost | |
| 2004/0112650 A1 | 6/2004 | Moseley | |
| 2004/0115435 A1 | 6/2004 | Griffin et al. | |
| 2004/0133301 A1 | 7/2004 | Van Doren et al. | |
| 2004/0154570 A1 | 8/2004 | Mabuchi et al. | |
| 2004/0168326 A1 | 9/2004 | Korb et al. | |
| 2004/0184687 A1 | 9/2004 | Morales et al. | |
| 2004/0223256 A1 | 11/2004 | Feng et al. | |
| 2004/0241448 A1 | 12/2004 | Kano et al. | |
| 2004/0242435 A1 | 12/2004 | Nishimura et al. | |
| 2004/0244539 A1 | 12/2004 | Korb et al. | |
| 2004/0261614 A1 | 12/2004 | Hamada et al. | |
| 2005/0001201 A1 | 1/2005 | Bocko et al. | |
| 2005/0005892 A1 | 1/2005 | Nishimura et al. | |
| 2005/0025975 A1 | 2/2005 | Okamoto et al. | |
| 2005/0035222 A1 | 2/2005 | Hamada et al. | |
| 2005/0037879 A1 | 2/2005 | Murata et al. | |
| 2005/0056241 A1 | 3/2005 | Nomura et al. | |
| 2005/0061291 A1 | 3/2005 | Nishimura et al. | |
| 2005/0061636 A1 | 3/2005 | Frost et al. | |
| 2005/0082139 A1 | 4/2005 | Ishikawa et al. | |
| 2005/0084390 A1 | 4/2005 | Ueno et al. | |
| 2005/0089685 A1 | 4/2005 | Hamada et al. | |
| 2005/0098134 A1 | 5/2005 | Nishimura et al. | |
| 2005/0100701 A1 | 5/2005 | Hamada et al. | |
| 2005/0115744 A1 | 6/2005 | Griffin et al. | |
| 2005/0188942 A1 | 9/2005 | Hamada et al. | |

FOREIGN PATENT DOCUMENTS

| | | |
|---|---|---|
| CN | 1099454 C | 1/2003 |
| DE | 643 034 | 3/1937 |
| DE | 19507086 C2 | 5/1996 |
| DE | 19507086 A1 | 9/1996 |
| DE | 197 04 224 | 8/1997 |
| DE | 198 15 989 | 10/1999 |
| DE | 198 25 860 | 12/1999 |
| DE | 19825860 A1 | 12/1999 |
| DE | 100 17 459 | 10/2000 |
| DE | 100 61 397 A1 | 5/2002 |
| DE | 101 58 683 | 6/2003 |
| DE | 103 18 135 | 11/2003 |
| DE | 10337559 A1 | 3/2005 |
| EP | 0 286 996 | 10/1988 |
| EP | 0 291 006 A2 | 11/1988 |
| EP | 0 299 785 | 1/1989 |
| EP | 0308143 B1 | 3/1989 |
| EP | 0 333 416 | 9/1989 |
| EP | 0378378 A1 | 7/1990 |
| EP | 0384772 A1 | 8/1990 |
| EP | 0388800 A2 | 9/1990 |
| EP | 0392125 A1 | 10/1990 |
| EP | 0398985 B1 | 11/1990 |
| EP | 407977 | 1/1991 |
| EP | 0 435 312 | 7/1991 |
| EP | 0474369 A1 | 3/1992 |
| EP | 0 500 253 | 8/1992 |
| EP | 0511153 A1 | 10/1992 |
| EP | 0 529 327 | 3/1993 |
| EP | 0392125 B1 | 3/1993 |
| EP | 0546824 A1 | 6/1993 |
| EP | 0308143 A1 | 11/1993 |
| EP | 0573943 A1 | 12/1993 |
| EP | 0619504 A1 | 10/1994 |
| EP | 0621136 A2 | 10/1994 |
| EP | 0624353 A3 | 11/1994 |
| EP | 0624354 A3 | 11/1994 |
| EP | 0378378 B1 | 1/1995 |
| EP | 0651069 A1 | 5/1995 |
| EP | 0652301 A2 | 5/1995 |
| EP | 0656458 A3 | 6/1995 |
| EP | 0 661 470 | 7/1995 |
| EP | 0396603 B1 | 6/1996 |
| EP | 0388800 B1 | 12/1996 |
| EP | 0 759 519 | 2/1997 |
| EP | 0474369 B1 | 3/1997 |
| EP | 0 818 622 | 1/1998 |
| EP | 0652301 B1 | 1/1998 |
| EP | 0826790 A1 | 3/1998 |
| EP | 0842754 A1 | 5/1998 |
| EP | 0 870 820 | 10/1998 |
| EP | 0816112 A3 | 10/1998 |
| EP | 0882759 A1 | 12/1998 |
| EP | 0893677 B1 | 1/1999 |
| EP | 0624353 B1 | 2/1999 |
| EP | 0656458 B1 | 2/1999 |
| EP | 0 905 221 A1 | 3/1999 |
| EP | 0 905 419 | 3/1999 |
| EP | 0647318 B1 | 3/1999 |
| EP | 0651069 B1 | 3/1999 |
| EP | 0 731 190 B1 | 5/1999 |
| EP | 0949200 A1 | 10/1999 |
| EP | 0845154 B1 | 11/1999 |
| EP | 0624354 B1 | 12/1999 |
| EP | 0582676 B1 | 3/2000 |
| EP | 1 018 538 A1 | 7/2000 |
| EP | 1063085 A1 | 12/2000 |
| EP | 1 067 211 | 1/2001 |
| EP | 0850126 B1 | 1/2001 |

| | | | | | | |
|---|---|---|---|---|---|---|
| EP | 1076087 | 2/2001 | | JP | 2000-88104 | 3/2000 |
| EP | 1078736 A1 | 2/2001 | | JP | 2000-119843 | 4/2000 |
| EP | 1109196 A1 | 6/2001 | | JP | 2000-504089 | 4/2000 |
| EP | 0778902 B1 | 9/2001 | | JP | 2000-297373 | 10/2000 |
| EP | 1 154 012 | 11/2001 | | JP | 2000-327484 | 11/2000 |
| EP | 0826790 B1 | 11/2001 | | JP | 2000-339083 | 12/2000 |
| EP | 1034320 B1 | 12/2001 | | JP | 2001-62605 | 3/2001 |
| EP | 0850133 B1 | 1/2002 | | JP | 2001-64005 | 3/2001 |
| EP | 0893677 B1 | 1/2002 | | JP | 2001-93141 A2 | 4/2001 |
| EP | 1184480 A2 | 3/2002 | | JP | 2001-172766 | 6/2001 |
| EP | 1190791 A3 | 4/2002 | | JP | 2001-172766 A2 | 6/2001 |
| EP | 1219464 A2 | 7/2002 | | JP | 2001-192864 | 7/2001 |
| EP | 1 233 054 A1 | 8/2002 | | JP | 2001-269938 | 10/2001 |
| EP | 0971812 B1 | 10/2002 | | JP | 2001-280236 | 10/2001 |
| EP | 1018291 B1 | 10/2002 | | JP | 2002-265968 A2 | 9/2002 |
| EP | 1281513 A2 | 2/2003 | | JP | 2002-309912 | 10/2002 |
| EP | 1 300 608 | 4/2003 | | JP | 2002-332571 | 11/2002 |
| EP | 0950123 B1 | 5/2003 | | JP | 2003-13163 | 1/2003 |
| EP | 0882759 B1 | 6/2003 | | JP | 2003-13799 | 1/2003 |
| EP | 1 338 641 | 8/2003 | | JP | 2003-25117 | 1/2003 |
| EP | 1340605 A1 | 9/2003 | | JP | 2003-28174 A2 | 1/2003 |
| EP | 1365141 A1 | 11/2003 | | JP | 2003-88939 | 3/2003 |
| EP | WO 03/095009 A1 | 11/2003 | | JP | 2003-113941 | 4/2003 |
| EP | 1083946 B1 | 12/2003 | | JP | 2003-147508 | 5/2003 |
| EP | 1078736 B1 | 1/2004 | | JP | 2004-36788 A2 | 2/2004 |
| EP | 1378271 A1 | 1/2004 | | JP | 2005-68529 A2 | 3/2005 |
| EP | 1 388 641 A1 | 2/2004 | | RU | 1770350 A1 | 10/1992 |
| EP | 0757615 B1 | 3/2004 | | RU | 2004586 C1 | 12/1993 |
| EP | 0842754 B1 | 3/2004 | | WO | WO 89/06707 A1 | 7/1989 |
| EP | 1 411 145 | 4/2004 | | WO | WO 89/06708 A1 | 7/1989 |
| EP | 0862395 B1 | 4/2004 | | WO | WO 8906338 A1 | 7/1989 |
| EP | 1 418 353 A2 | 5/2004 | | WO | WO 92/02602 | 2/1992 |
| EP | 1440775 A1 | 7/2004 | | WO | WO 9206843 A1 | 4/1992 |
| EP | 1445119 A1 | 8/2004 | | WO | WO 9219425 A2 | 11/1992 |
| EP | 1475557 A1 | 11/2004 | | WO | WO 93/21288 | 10/1993 |
| EP | 1481699 A1 | 12/2004 | | WO | WO 93/21289 | 10/1993 |
| EP | 1482190 A2 | 12/2004 | | WO | WO 9324828 A1 | 12/1993 |
| EP | 1498597 A1 | 1/2005 | | WO | WO 95/20253 A2 | 7/1995 |
| EP | 1 510 594 A2 | 3/2005 | | WO | WO 95/29044 A1 | 11/1995 |
| EP | 1311885 B1 | 3/2005 | | WO | WO 95/29273 A1 | 11/1995 |
| EP | 1512781 A2 | 3/2005 | | WO | WO 95/31584 A1 | 11/1995 |
| EP | 1183470 B1 | 4/2005 | | WO | WO 96/04485 | 2/1996 |
| FR | 2 669 689 | 5/1992 | | WO | WO 96/05333 A1 | 2/1996 |
| GB | 768226 | 2/1957 | | WO | WO 96/05942 A1 | 2/1996 |
| GB | 1005638 | 10/1988 | | WO | WO 96/06961 A1 | 3/1996 |
| GB | 2338716 | 12/1999 | | WO | WO 96/12389 A1 | 4/1996 |
| JP | 62-111106 | 5/1987 | | WO | WO 96/24488 A1 | 8/1996 |
| JP | 63-21209 A2 | 1/1988 | | WO | WO 96/40446 A1 | 12/1996 |
| JP | 63-288994 A2 | 11/1988 | | WO | WO 97/07531 A1 | 2/1997 |
| JP | 5-70879 | 3/1993 | | WO | WO 97/10093 A1 | 3/1997 |
| JP | 5-36004 | 5/1993 | | WO | WO 97/10940 A1 | 3/1997 |
| JP | 5-42616 | 6/1993 | | WO | WO 97/14555 | 4/1997 |
| JP | 6-264993 | 9/1994 | | WO | WO 97/16138 A1 | 5/1997 |
| JP | 6-294307 A | 10/1994 | | WO | WO 98/02715 A1 | 1/1998 |
| JP | 7-63135 | 3/1995 | | WO | WO 98/12994 A1 | 4/1998 |
| JP | 07-090553 | 4/1995 | | WO | WO 98/13528 A1 | 4/1998 |
| JP | 7-90553 A | 4/1995 | | WO | WO 98/47141 A1 | 10/1998 |
| JP | 7-103238 | 4/1995 | | WO | WO 98/58042 A1 | 12/1998 |
| JP | 07-118832 | 5/1995 | | WO | WO 99/09547 A1 | 2/1999 |
| JP | 7-41386 A2 | 10/1995 | | WO | WO 99/12404 A1 | 3/1999 |
| JP | 7-286696 | 10/1995 | | WO | WO 99/14512 A1 | 3/1999 |
| JP | 8-14014 | 1/1996 | | WO | WO 99/16371 A1 | 4/1999 |
| JP | 8-61499 | 3/1996 | | WO | WO 99/22694 A2 | 5/1999 |
| JP | 9-20981 A2 | 1/1997 | | WO | WO 99/27157 A1 | 6/1999 |
| JP | 52006318 | 1/1997 | | WO | WO 99/29477 A1 | 6/1999 |
| JP | 253770 A2 | 9/1997 | | WO | WO 99/31557 A1 | 6/1999 |
| JP | 10-088369 A2 | 4/1998 | | WO | WO 99/34385 A1 | 7/1999 |
| JP | 10-265790 | 10/1998 | | WO | WO 99/46847 A1 | 9/1999 |
| JP | 10-298440 A2 | 11/1998 | | WO | WO 99/54520 A1 | 10/1999 |
| JP | 11-22423 | 1/1999 | | WO | WO 99/54934 A1 | 10/1999 |
| JP | 11-292629 A2 | 10/1999 | | WO | WO 99/57743 A1 | 11/1999 |
| JP | 11-294118 | 10/1999 | | WO | WO 99/62077 A1 | 12/1999 |
| JP | 11-333773 A2 | 12/1999 | | WO | WO 99/62572 A1 | 12/1999 |

| | | |
|---|---|---|
| WO | WO 00/22613 A1 | 4/2000 |
| WO | WO 00/24554 A1 | 5/2000 |
| WO | WO 00/25410 A1 | 5/2000 |
| WO | WO 00/28142 A1 | 5/2000 |
| WO | WO 00/33051 A1 | 6/2000 |
| WO | WO 00/35000 A1 | 6/2000 |
| WO | WO 00/44032 A1 | 7/2000 |
| WO | WO 00/47402 A1 | 8/2000 |
| WO | WO 00/55385 A1 | 9/2000 |
| WO | WO 00/56127 A1 | 9/2000 |
| WO | WO 00/56393 A1 | 9/2000 |
| WO | WO 00/62327 A2 | 10/2000 |
| WO | WO 00/68451 A2 | 11/2000 |
| WO | WO 00/75517 A1 | 12/2000 |
| WO | WO 00/78504 A1 | 12/2000 |
| WO | WO 01/05917 | 1/2001 |
| WO | WO 01/06033 A1 | 2/2001 |
| WO | WO 01/14736 A1 | 3/2001 |
| WO | WO 01/14745 A1 | 3/2001 |
| WO | WO 01/26862 A1 | 4/2001 |
| WO | WO 01/37631 A2 | 5/2001 |
| WO | WO 01/40537 A1 | 6/2001 |
| WO | WO 01/47451 A1 | 7/2001 |
| WO | WO 01/59544 A2 | 8/2001 |
| WO | WO 01/61182 | 8/2001 |
| WO | WO 01/61719 A1 | 8/2001 |
| WO | WO 01/62372 A1 | 8/2001 |
| WO | WO 01/63639 A1 | 8/2001 |
| WO | WO 01/67834 A1 | 9/2001 |
| WO | WO 01/79583 A2 | 10/2001 |
| WO | WO 01/80224 A2 | 10/2001 |
| WO | WO 02/06875 A1 | 1/2002 |
| WO | WO 02/13188 A1 | 2/2002 |
| WO | WO 02/24601 A1 | 3/2002 |
| WO | WO 02/24603 A1 | 3/2002 |
| WO | WO 02/24970 A2 | 3/2002 |
| WO | WO 02/32625 A2 | 4/2002 |
| WO | WO 02/44440 A1 | 6/2002 |
| WO | WO 02/054454 A2 | 7/2002 |
| WO | WO 02/062714 A2 | 8/2002 |
| WO | WO 02/073021 | 9/2002 |
| WO | WO 02/080996 A1 | 10/2002 |
| WO | WO 02/085237 A2 | 10/2002 |
| WO | WO 02/090461 A1 | 11/2002 |
| WO | WO 02/097289 A1 | 12/2002 |
| WO | WO 03/009978 A1 | 2/2003 |
| WO | WO 03/013990 A1 | 2/2003 |
| WO | WO 03/020329 A1 | 3/2003 |
| WO | WO 03/021731 A1 | 3/2003 |
| WO | WO 03/031543 A2 | 4/2003 |
| WO | WO 03/046508 A1 | 6/2003 |
| WO | WO 03/054876 A1 | 7/2003 |
| WO | WO 03/076309 A2 | 9/2003 |
| WO | WO 03/078679 A1 | 9/2003 |
| WO | WO 03/091758 A2 | 11/2003 |
| WO | WO 03/105134 A1 | 12/2003 |
| WO | WO 2004/001804 A2 | 12/2003 |
| WO | WO 2004/004998 A1 | 1/2004 |
| WO | WO 2004/019809 A2 | 3/2004 |
| WO | WO 2004/024206 A1 | 3/2004 |
| WO | WO 2004/026359 A1 | 4/2004 |
| WO | WO 2004/026500 A2 | 4/2004 |
| WO | WO 2004/036169 A1 | 4/2004 |
| WO | WO 2004/036292 A2 | 4/2004 |
| WO | WO 2004/038701 A2 | 5/2004 |
| WO | WO 2004/043631 A1 | 5/2004 |
| WO | WO 2004/048126 A2 | 6/2004 |
| WO | WO 2004/067466 A1 | 8/2004 |
| WO | WO 2004/068530 A1 | 8/2004 |
| WO | WO 2004/071670 A1 | 8/2004 |
| WO | WO 2004/072959 A2 | 8/2004 |
| WO | WO 2004/078424 A2 | 9/2004 |
| WO | WO 2004/084773 A1 | 10/2004 |
| WO | WO 2004/088113 A1 | 10/2004 |
| WO | WO 2005/010596 A2 | 2/2005 |
| WO | WO 2005/011744 A2 | 2/2005 |
| WO | WO 2005/014760 A1 | 2/2005 |
| WO | WO 2005/014882 A1 | 2/2005 |
| WO | WO 2005/016620 A2 | 2/2005 |
| WO | WO 2005/021851 A1 | 3/2005 |
| WO | WO 2005/0025844 A1 | 3/2005 |
| WO | WO 2005/034791 A1 | 4/2005 |
| WO | WO 2005/037144 A2 | 4/2005 |
| WO | WO 2005/037985 A2 | 4/2005 |
| WO | WO 2005/040451 A1 | 5/2005 |
| WO | WO 2005/042064 A1 | 5/2005 |
| WO | WO 2005/047737 A1 | 5/2005 |

OTHER PUBLICATIONS

Hershberger, J., et al., "Evaluation of DLC Coatings for Spark-Ignited, Direct-Injected Fuel Systems," *Surface & Coatings Technology*, 179, 2004, pp. 237-244.

Hershberger, J, et al., "Friction and Wear Behavior of Near-Frictionless Carbon Coatings in Formulated Gasolines," *Surface & Coating Technology*, 183, 2004, pp. 111-117.

Kovalchenko, A., et al., "Friction and Wear Performance of Low-Friction Carbon Coatings Under Oil Lubrication," Energy Technology Div., Argonne National Laboratory.

Ajayi, O., et al., "Effect of Carbon Coating on Scuffing Performance in Diesel Fuels" *Tribology Transactions*, vol. 44, 2001, pp. 298-304.

Ajayi, O., et al., Effect of Thin-Film Coating on Wear in EGR-Contaminated Oil, Energy Technology Div., Argonne National Laboratory.

Fujimori, N., et al., "Characterization of Conducting Diamond Films," *Vacuum*, vol. 36, Nos. 1-3, 1996, pp. 99-102.

Patent/Literature Search Report, Bawa Biotechnology Consulting, LLC, Jun. 3, 2005 (201 pages).

Japanese Industrial Standard, "Aluminium Alloy Castings", JIS H 5202, 1999, pp. 1910, 1911 and 1636-1647.

"Aluminum Alloy Die Castings," JIS H5302 (2000), pp. 1670-1681.

"Assessment of 2nd to 5th Order Irregularities of Surface Configuration by Means of Sections of Surfaces Definitions Relating to Reference System and Dimensions," DIN 4762, UDC 621-288:001.4 (Aug. 1960), pp. 1-4.

API Motor Oil Guide, Which Oil Is Right for You, American Petroleum Institute, Copyright 2002.

"Carbon Steels for Machine Structural Use", Japanese Industrial Standard (JIS G 4051), 1979, pp. 1381-1383.

"Carbon Steels for Machine Structural Use", Japanese Industrial Standard (JIS G 4051), 1979, pp. 1-10.

"Chromium Molybdenum Steels," Japanese Industrial Standard (JIS G 4105), 1979, pp. 1-11 (with Translation).

"Chromium Steels," Japanese Industrial Standard (JIS G 4104), 1979, pp. 1-9.

D.G. Watson et al., "Engineering Drawing Practice," XP002281300, University of Hertfordshire, Sep. 1991, p. 29, Figure 38.

Database WPI, Nov. 28, 2000, Derwent Publications, Ltd., AN 2000640583, XP002240184, JP 2000-327484, Nov. 28, 2000.

Dr. Marx, "Surfaces and Contact Mechanics", XP-002233233, Google, Retrieved from the Internet, Mar. 3, 2003, pp. 1-18.

Engine Oil Viscosity Classification—SAE J300 revised Apr. 1997, p. 133.

"Geometrical Product Specifications (GPS)—Surface Texture: Profile Method—Terms, Definitions and Surface Texture Parameters," International Standard, ISO 4287, TC 213 (1997), pp. 1-25.

"Geometrical Product Specifications (GPS)—Surface texture: Profile method—Terms, definitions and surface texture parameters", Japanese Industrial Standard (JIS B 0601) Machine Elements, 2003, pp. 6, 7, 263-287, and 2586.

"Grey iron castings", Japanese Industrial Standard (JIS G 5501), pp. 2075-2077.

Japanese Industrial Standard, "High Carbon Chromium Bearing Steels", JIS G 4805, 1999, pp. 1-31 (with translation).

International Standard "Application of Carbides for Machining by Chip Removal—Designation of the Main Groups of Chip Removal and Groups of Application," ISO 513, (1975), pp. 67-69.

Japanese Industrial Standard, "Structural Steels with Specified Hardenability Bands", JIS G 4052, 1979, pp. 2414, 2415, 1390-1403, 1410 and 1411.

JIS Japanese Industrial Standard; "Surface Roughness—Definitions and Designation"; JIS B 0601; 1994. (w/Translation).

JIS Japanese Industrial Standard; "Vickers Hardness Test—Test Method"; JIS Z 2244; 1998; (w/Translation).

Japanese Industrial Standard, 2001, No. B 0601.

K. Holmberg et al., "Tribological Characteristics of Diamond-like Carbon Coatings," VTT Symposium, Technical Research Centre of Finland, XP000570636, 1994, pp. 24-238.

Kano et al., "Friction Characteristics of a Hard Carbon Film in Engine Oil, (No. 2) (Surface Analysis Result of Sliding Surface)," Japan Tribology Congress 1999, 5, pp. 11-12.

Meyer-Rässler, "Neuartige Lauffächen-Schutzverfahren für Kolben von Verbrennungsmotoren," VDI-Zeitschrift, 1942, vol. 86, No. 15/16, pp. 245 to 247.

Patent Abstracts of Japan, vol. 1996, No. 09, Sep. 30, 1996, JP 08-128448, May 21, 1996.

Patent Abstracts of Japan, vol. 2000, No. 01, Jan. 31, 2000, JP 11-287329, Oct. 19, 1999.

Patent Abstracts of Japan, vol. 2000, No. 09, Oct. 13, 2000, JP 2000-170768, Jun. 20, 2000.

"Stainless Steel Bars", Japanese Industrial Standard (JIS G 4303), pp. 1457-1477.

"Standard Practice for Codification of Certain Nonferrous Metals and Alloys, Cast and Wrought1", ASTM International, Designation: B 275-02, Jun. 2002, pp. 1-7.

"Standard Test Method for Calibration and Operation of the Falex Block-on-Ring Friction and Wear Testing Machine", ASTM Designation: D2714—88, Jan. 1989, pp. 383-386.

"Standard Test Method for Separation of Representative Aromatics and Nonaromatics Fractions of High-Boiling Oils by Elution Chromatography", ASTM Designation: D 2549—91 (Reapproved 1995), pp. 895-900.

Steve J. Bull et al., "High-Performance Diamond and Diamond-like Coatings", JOM, Apr. 1995, pp. 16-19, vol. 47, No. 4, XP000500980.

Patent Abstracts of Japan, vol. 2003, No. 12, Dec. 5, 2003, JP 2004-155891, Jun. 3, 2004.

U.S. Appl. No. 10/911,741, filed May 5, 2004, Ueno.

Ronkainen, Helena, "Tribological Properties of Hydrogenated and Hydrogen-Free Diamond-Like Carbon Coatings," Disseration for the Degree of Doctor of Science in Technology, VTT Publications No. 434.

F. Chinas-Castillo et al.; "Film Formation by Colloidal Overbased Detergents in Lubricated Contacts," Tribology Transactions, vol. 43, Feb. 1, 2000, Nashville, Tennessee, pp. 357-366.

P. Thompson et al., "Structure and Shear Response in Nanometer-Thick Films," Israel Journal of Chemistry, vol. 35, Feb. 23, 1995, North Carolina, pp. 93-106.

Kano et al., Japan Tribology Congress, 1999, pp. 11-12.

"Petroleum products—Determination of base No.—Perchloric acid potentiometric titration method", International Organization of Standardization (ISO 3771), Aug. 15, 1994, pp. 1-8.

"Standard Test Method for Separation of Representative Aromatics and Nonaromatics Fractions of High-Boiling Oils by Elution Chromatography", American Society for Testing and Materials (ASTM D 2549), 1995, pp. 895-900.

E. Meyer-Rässler, "Neuartige Lauffächen-Schutzverfahren für Kolben von Verbrennungsmotoren", VDI-Zeitschrift Bd., Apr. 18, 1942, pp. 245-247, vol. 86, No. 15-16.

"Aluminium Alloys Castings", Japanese Industrial Standard (JIS H 5202), 1999, pp. 1-18.

"Geometrical Product Specifications (GPS)—Surface texture: Profile method—Terms, definitions and surface texture parameters", Japanese Industrial Standard (JIS B 0601) Machine Elements, 2003, pp. 263-287.

"Chromium Steels," Japanese Industrial Standard (JIS G 4104), 1979, pp. 1-9.

"Chromium Molybdenum Steels," Japanese Industrial Standard (JIS G 4105), 1979, pp. 1-11.

"High Carbon Chromium Bearing Steels," Japanese Industrial Standard (JIS G 4805), 1999, pp. 1-31.

"Aluminium Alloy Die Castings," Japanese Industrial Standard (JIS H 5302), 2000, pp. 1-12.

M. Kano et al., "The Effect of ADDP and MODTC Additives on Friction Properties of DLC and Steel CAM Follower in Engine Oil," $2^{nd}$ World Tribology Congress, Sep. 3-7, 2001, p. 342.

U.S. Appl. No. 10/468,713, filed Aug. 22, 2003, Mabuchi et al.

* cited by examiner

LOAD : 50 kgf
MATED PIN (Rigid)
TEST PIECE : DISC
ROTATION

LOW-FRICTION SLIDING MEMBER AND LOW-FRICTION SLIDING MECHANISM USING SAME

CROSS-REFERENCE TO RELATED APPLICATIONS

This application has the following related applications: U.S. patent application Ser. No. 09/545,181 based on Japanese Patent Application Hei-11-102205 filed Apr. 9, 1999; Ser. No. 10/468,713 which is the designated state (United States) application number of PCT Application JP02/10057 based on Japanese Patent Application 2001-117680 filed Apr. 17, 2001; Ser. No. 10/355,099 based on Japanese Patent Application 2002-45576 filed Feb. 22, 2002; Ser. No. 10/682,559 based on Japanese Patent Application No. 2002-302205 filed Oct. 16, 2002; and Ser. No. 10/692,853 based on Japanese Patent Application 2002-322322 filed Oct. 16, 2002.

BACKGROUND OF THE INVENTION

This invention relates to improvements in a low-friction sliding member and a low-friction sliding mechanism using the sliding member, and more particularly to the low-friction sliding member and low-friction sliding mechanism using the sliding member, excellent in low-friction characteristics.

Global environmental problems such as global warming and ozone layer destruction are coming to the fore. As it has been said that the global warming is significantly affected by $CO_2$ emission, the reduction of $CO_2$ emission, notably the setting of $CO_2$ emission standards, has become a big concern to each country. One of challenges to reduce $CO_2$ emission is to lower an energy loss due to friction loss of machines, facilities and the like, particularly to improve vehicle fuel efficiency or fuel economy that depends on the performance of engine sliding members and a lubricating oil applied thereto. There are the following approaches to improve the vehicle fuel efficiency: (1) lowering the viscosity of the lubricating oil, thereby reducing viscous resistance in hydrodynamic lubrication regions and agitation resistance in the engine; and (2) adding a suitable friction modifier and other additives into the lubricating oil so as to reduce friction losses under the conditions of mixed lubrication and boundary lubrication.

In view of the foregoing, many studies have been made on various friction modifiers including organomolybdenum compounds, such as molybdenum dithiocarbamate (MoDTC) and molybdenum dithiophosphate (MoDTP). As a result of the studies, it has been found that the lubricating oil containing an organomolybdenum compound successfully provides a friction reducing effect on conventional steel sliding members in the early stages of use.

SUMMARY OF THE INVENTION

Heretofore, application of hard coating materials to the engine sliding members has been also examined so that the sliding members can attain high wear resistance and a low friction coefficient. Above all, a diamond-like carbon (DLC) material is known for its low-friction performance in the air and therefore expected to be useful as a coating material for the sliding members.

However, the DLC material does not provide a low friction coefficient in the presence of a lubricating oil, as disclosed in Japan Tribology Congress 1999. 5, Tokyo, Proceeding Page 11-12, KANO et al. Even when used in combination with the lubricating oil containing an organomolybdenum compound, the DLC material cannot provide a sufficiently low friction coefficient, as disclosed in World Tribology Congress 2001. 9, Vienna, Proceeding Page 342, KANO et al.

As a reason for the above, it has been confirmed that the DLC material is chemically inert, and therefore a so-called tribo-film containing $MOS_2$ providing a low shearing force cannot be formed at the sliding surface of the DLC material although it is formed at the sliding surface of steel.

It is therefore an object of the present invention to provide improved low-friction sliding member and low-friction sliding mechanism using the sliding member, by which drawbacks encountered in conventional sliding members and sliding mechanisms using the sliding members can be effectively overcome.

Another object of the present invention is to provide improved low-friction sliding member and low-friction sliding mechanism using the sliding member, which can exhibit an extremely excellent low-friction characteristics at sliding surfaces in various use and conditions, particularly an excellent low shearing force as compared with a conventional combination of steel material and an organomolybdenum compound.

An aspect of the present invention resides in a low-friction sliding member comprising a base material having a surface. A hard carbon thin film is formed at at least a part of the surface of the base material. Here, a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound.

Another aspect of the present invention resides in a low-friction sliding mechanism comprising a first low-friction sliding member which includes a base material having a surface, and a hard carbon thin film formed at at least a part of the surface of the base material, in which a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound. Additionally, at least one of a second low-friction sliding member and a metal member having a sliding surface is provided serving as the opposite member. The second low-friction sliding member includes a base material having a surface of the base material, and a hard carbon thin film formed at at least a part of the surface, in which a tribo-film having at least one functional group selected from the group consisting of ether linkage, oxido and hydroxyl group is formed on the hard carbon thin film when the hard carbon thin film is in slidable contact with the opposite member in presence of the organic oxygen-containing compound. Here, the organic oxygen-containing compound is present in a sliding surface site formed between a sliding surface of the first low-friction sliding member and the sliding surface of at least one of the second low-friction sliding member and the metal member.

A further aspect of the present invention resides in a low-friction sliding mechanism comprising a first low-friction sliding member which includes a base material having a surface, and a hard carbon thin film formed at at least a part of the surface of the base material, in which a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound. Additionally, at least one of a second low-friction sliding member and a metal member having a sliding surface is provided serving as the opposite member. The second low-friction sliding member includes a base material having a surface of the base material, and a hard carbon thin film formed at at least apart of the surface, in which a tribo-film having at least one functional group selected from the group consisting of ether linkage, oxido and hydroxyl group is formed on the hard carbon thin film when the hard carbon thin film is in slidable contact with the opposite member in presence of the organic oxygen-containing compound. Here, lubricating oil is present in a sliding surface site formed between a sliding surface of the first low-friction sliding member and the sliding surface of at least one of the second low-friction sliding member and the metal member, the lubricating oil containing the organic oxygen-containing compound.

A still further aspect of the present invention resides in a process for reducing friction of a sliding member including a base material having a surface. The process comprises (a) forming a hard carbon thin film at at least a part of the surface of the base material; and (b) forming a tribo-film having at least one functional group selected from the group consisting of ether linkage, oxido and hydroxyl group on the hard carbon thin film when the hard carbon thin film is in slidable contact with an opposite member in presence of an organic oxygen-containing compound.

DETAILED DESCRIPTION OF THE INVENTION

The present invention will be discussed below in detail. In the following description, all percentages (%) are by mass unless otherwise specified.

According to the present invention, a low-friction sliding member comprises a base material having a surface. A hard carbon thin film is formed at at least a part of the surface of the base material. Here, a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound.

More specifically, the low-friction sliding member according to the present invention comprises the base material having the surface. At least a part of the surface is coated with the hard carbon thin film. Examples of the hard carbon thin film are thin films formed of a DLC (diamond-like carbon) material which is an amorphous material principally formed by carbon element, of which carbon-carbon bond includes a diamond structure ($sp^3$ bond) and a graphite bond ($sp^2$ bond). Specific examples include a-C (amorphous carbon) formed solely of carbon, a-C:H (hydrogenated amorphous carbon) containing hydrogen, and metal containing DLC (MeC) containing partially a metal element such as titanium (Ti) or molybdenum (Mo). From the viewpoint of obtaining a large friction reducing effect, the DLC material to be used has a smaller hydrogen content preferably, not higher than 20 atomic %, more preferably, not higher than 5 atomic %, further more preferably not higher than 1 atomic %, and further more preferably not higher than 0.5 atomic %. It is also preferable to use a-C based or type DLC material containing substantially not hydrogen.

As a film-forming method for the above hard carbon thin film, typically ion plating process and magnetron sputtering process can be employed.

The hard carbon thin film may be formed of CNx material, COx material, CFx material, or a nano-crystallized diamond of these materials.

Figure 2:
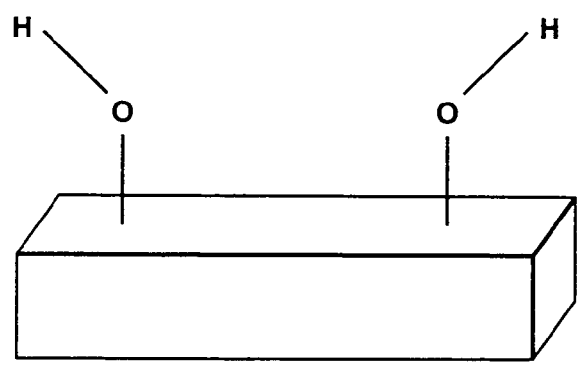
FIG. 2 is a schematic illustration of a tribo-film formed at the surface of a hard carbon thin film during friction of the hard carbon thin film with an opposite member.

When the hard carbon thin film coated on the base material is in sliding contact with the sliding surface of the opposite member, the tribo-film having a functional group such as ether linkage, oxido and hydroxyl group and any combinations of ether linkage, oxido and hydroxyl group is formed at the surface of the hard carbon thin film under friction in presence of the organic oxygen-containing compound between the hard carbon thin film and the sliding surface of the opposite member. This tribo-film means a coating film formed under chemical reaction during friction, between the hard carbon thin film and the opposite member, for example, as schematically illustrated in FIG. 2 in which the tribo-film having hydroxyl groups are formed at the surface of the hard carbon thin film shown as a block during friction of the hard carbon thin film with the opposite member.

It is preferable that the tribo-film has a thickness of not more than 10 nm and is formed within a range from the sliding surface (in sliding contact the opposite member) of the sliding member to a depth of 10 nm from the sliding surface during friction between the hard carbon thin film and the opposite member, the sliding surface of the sliding member being in sliding contact with the opposite member. This can lower a friction coefficient at the sliding surface site or sliding-contact site. The above tribo-film has a lower friction characteristics than that of a tribo-film which does not have having a functional group(s) such as ether, oxido and/or alcohol and any combinations of ether linkage, oxido and hydroxyl group.

The hard carbon thin film preferably has a surface roughness Ra of 0.1 μm or less, preferably 0.08 μm or less, in consideration of stability of sliding. A surface roughness exceeding 0.1 μm may result in formation of a local scuffing, thereby significantly increasing the frictional coefficient. Additionally, the hard carbon thin film preferably has a surface hardness in micro-Vickers hardness (under a load of 10 g), of Hv 1000 to 3500, and a film thickness of 0.3 to 2.0 μm. In case the surface hardness and the thickness of the hard carbon thin film are not within the aforementioned ranges, abrasion tends to occur for Hv less than 1000 or the film thickness less than 0.3 μm while peeling tends to occur when Hv exceeds 3500 and/or the film thickness exceeds 2.0 μm. The surface roughness Ra is explained as $R_{a75}$ in JIS (Japanese Industrial Standard) B 0601 (:2001).

A material (base material) constituting a part other than the hard carbon thin film, of the sliding member is not particularly restricted but can be a metal material such as a ferrous material, an aluminum-based material, a magnesium-based material or a titanium-based material. In particular, a ferrous material, an aluminum-based material or a magnesium-based material is preferred as it is easily applicable to a sliding part or section of machines or apparatuses and can contribute to energy saving measures in various fields. For the material constituting the part other than the hard carbon thin film of the sliding member, there can also be employed a non-metal material such as a resin, plastics, carbon or the like. Also a material formed by applying a thin film coating of various kinds on metal or non-metal materials is useful as the material constituting the part other than the hard carbon thin film, of the sliding member. It will be understood that the part other than the hard carbon thin film, of the sliding member may be the base material having the sliding surface at which the hard carbon thin film is formed.

The ferrous material is not particularly restricted and can be not only iron of high purity but also various ferrous alloys (alloys with nickel, copper, zinc, chromium, cobalt, molybdenum, lead, silicon and/or titanium, or any combination thereof). Specific examples include cemented steel SCM 420 and SCr 420 according to Japanese Industrial Standard (JIS).

The aluminum-based material is not particularly restricted and can be not only aluminum of high purity but also various aluminum-based alloys. Specifically, a hypo-eutectic or hyper-eutectic aluminum alloy containing, for example, silicon (Si) by 4 to 20% and copper (Cu) by 1.0 to 5.0% is desirable. Preferred examples of the aluminum alloy include AC2A, AC8A, ADC12 and ADC14 according to JIS.

Further, the material formed by applying a thin film coating of various kinds on metal materials is not particularly restricted, and can specifically be a metal material such as the ferrous material, the aluminum-based material, the magnesium-based material or the titanium-based material mentioned above with a thin film (surfacial) coating such as of TiN, CrN or the aforementioned DLC material, among which a metal material coated with the DLC material is preferable. It is further preferred that the DLC material is diamond-like carbon of a-C type and containing substantially no hydrogen.

Next, a low-friction sliding mechanism according to the present invention will be discussed in detail.

The low-friction sliding mechanism comprises a first low-friction sliding member which includes a base material having a surface, and a hard carbon thin film formed at at least a part of the surface of the base material, in which a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound. Additionally, at least one of a second low-friction sliding member and a metal member having a sliding surface is provided serving as the opposite member. The second low-friction sliding member includes a base material having a surface of the base material, and a hard carbon thin film formed at at least apart of the surface, in which a tribo-film having at least one functional group selected from the group consisting of ether linkage, oxido and hydroxyl group is formed on the hard carbon thin film when the hard carbon thin film is in slidable contact with the opposite member in presence of the organic oxygen-containing compound. Here, the organic oxygen-containing compound or lubricating oil containing the organic oxygen-containing compound is present in a sliding surface site formed between a sliding surface of the first low-friction sliding member and the sliding surface of at least one of the second low-friction sliding member and the metal member.

Thus, the low-friction sliding mechanism includes the above-discussed low-friction sliding member. More specifically, the low-friction sliding mechanism has a sliding surface site constituted by the sliding surfaces of two or more of the low-friction sliding member and/or another sliding surface site constituted by the sliding surfaces of the low-friction sliding member and a metal member. It is to be noted that the organic oxygen-containing compound is present at the above sliding surface sites, serving as an ashless friction modifier. With such arrangement, the extremely thin tribo-film is formed on the sliding surfaces thereby exhibiting an excellent low shearing force.

Here, a material of the above-mentioned metal member is for example, the ferrous material, the aluminum-based material, the magnesium-based material or the titanium-based material. The material may be the ferrous material, the aluminum-based material, the magnesium-based material or the titanium-based material coated with a thin film (surfacial) coating such as of TiN, CrN or the aforementioned DLC material.

In case that the ferrous material is used as the material of the metal member, it is preferable that the ferrous material has a surface hardness, in Rockwell hardness in C scale (HRC), of 45 to 60. Such condition is effective as it can maintain the durability of the thin film even in a sliding condition under a high Hertz's contact pressure of about 700 MPa as in a cam follower member. If the surface hardness is less than 45 (HRC), buckling tends to occur under a high Hertz's contact pressure.

Also in case that aluminum-based material is used as the material of the metal member, it is preferable that the aluminum-based material has a surface hardness or Brinell hardness HB of 80 to 130. In case that the surface hardness of the aluminum-based material is outside the aforementioned range, the aluminum-based material may become easily worn at HB less than 80.

In case that the metal member coated with a thin film (surfacial) coating, particularly the DLC material, is used as the material of the metal member, it is preferable that the material has a surface hardness, in micro-Vickers hardness (under a load of 10 g), of Hv 1000 to 3500, and a film (DLC material) thickness of 0.3 to 2.0 μm. In case that the surface hardness and the film thickness are not within the aforementioned ranges, wear tends to occur for Hv less than 1000 or the thickness less than 0.3 μm while peeling tends to occur when Hv exceeds 3500 and/or the thickness exceeds 2.0 μm.

In the low-friction sliding mechanism of the present invention, the above-mentioned sliding surface site is formed, for example, at a sliding part or member in an internal combustion engine of 4 stroke cycle or 2 stroke cycle type, such as a part in a valve driving system, a piston, a piston ring, a piston skirt section, a cylinder liner section, a connecting rod, a crank shaft, a bearing, a bearing metal, a gear, a chain, a belt, an oil pump etc., also a part in a drive transmission system (for example gears), a sliding part in a hard disc drive (HDD) system, a surgery instrument (with, for example, glycerol), a sliding part of a micro-machine MEMS (for biological applications), and other various sliding parts subjected to a severe frictional condition and requiring a low friction. In such sliding surface site, it is possible to achieve higher lubrication and obtain an extremely excellent low-frictional characteristics in comparison with conventional technology, merely by applying a DLC (material) coating to at least one of the sliding members at the sliding surface site and supplying the organic oxygen-containing compound to the sliding surface site.

A preferred embodiment in a valve driving system of an internal combustion engine is a sliding surface site formed by a crown surface of a lifter or a disc-shaped shim formed by making DLC coating on a ferrous (steel) base material and a cam lobe formed of low-alloy chilled cast iron, cemented steel, refined carbon steel or a material constituted of an arbitrary combination thereof.

On the other hand, the aforementioned organic oxygen-containing compound is not particularly restricted and can be any organic compound containing oxygen in the molecule. For example, it may be an organic oxygen-containing compound constituted of carbon, hydrogen and oxygen. The organic oxygen-containing compound may contain another element such as nitrogen, sulfur, halogen (fluorine, chlorine etc.), phosphorus, boron, a metal, or the like. Particularly in view of further reducing the friction in the sliding surface site defined by the sliding members, there is preferred an organic oxygen-containing compound constituted of carbon, hydrogen and oxygen and containing a hydroxyl group, or a derivative thereof, in which it is more preferred that two or more hydroxyl groups are contained. Also for the same reason, there is more preferred an organic oxygen-containing compound with a low sulfur content or free from sulfur.

Also a "derivative" used herein is not particularly restricted and can be, for example, a compound obtained by reacting an organic oxygen-containing compound constituted of carbon, hydrogen and oxygen with a nitrogen-containing compound, a phosphorus-containing compound, sulfur or a sulfur-containing compound, a boron-containing compound, a halogen element or a halogen-containing compound, a metal element, a metal-containing compound (organic or inorganic), or the like.

The aforementioned organic oxygen-containing compound can specifically be a compound containing a hydroxyl group, a carboxyl group, a carbonyl group, an ester bond or an ether bond (two or more kinds of such group or bond may also be contained), preferably contains one or more kinds of group or bond selected from a hydroxyl group, a carboxyl group, a carbonyl group, and an ester bond, more preferably is an organic oxygen-containing compound containing one or more kinds of group or bond selected from a hydroxyl group, a carboxyl group and an ester group, further preferably is an organic oxygen-containing compound containing one or more kinds of group selected from a hydroxyl group and a carboxyl group, and particularly preferably an organic oxygen-containing compound containing one or more hydroxyl groups.

More specific examples of the organic oxygen-containing compound include alcohols, carboxylic acids, ethers, esters, ketones, aldehydes, carbonates (these compounds may further contain one or more kinds of group or bond selected from a hydroxyl group, a carboxyl group, a carbonyl group, an ester bond and an ether bond), derivatives thereof and an arbitrary mixture thereof.

The above-mentioned alcohols are organic oxygen-containing compounds represented by the following general formula (1):

R—(OH)$_n$ (1), for example, a compound containing one or more hydroxyl groups.

Examples of alcohols are mentioned below.

1.1 Monoalcohols.

1.2 Dialcohols.

1.3 Tri and Higher Polyalcohols.

1.4 Alkyleneoxide Adducts of Alcohols Selected from the above 1.1 to 1.3.

1.5 Mixtures of One or More Selected from the above 1.1 to 1.4.

Monoalcohols (1.1) have one hydroxyl group in the molecule, including, for example, monohydric alkyl alcohols having from 1 to 40 carbon atoms (in which the alkyl group may be linear or branched) such as methanol, ethanol, propanol (1-propanol, 2-propanol), butanol (1-butanol, 2-butanol, 2-methyl-1-propanol, 2-methyl-2-propanol), pentanol (1-pentanol, 2-pentanol, 3-pentanol, 2-methyl-1-butanol, 3-methyl-1-butanol, 3-methyl-2-butanol, 2-methyl-2-butanol, 2,2-dimethyl-1-propanol), hexanol (1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,3-dimethyl-1-butanol, 2,3-dimethyl-2-butanol, 3,3-dimethyl-1-butanol, 3,3-dimethyl-2-butanol, 2-ethyl-1-butanol, 2,2-dimethylbutanol), heptanol (1-heptanol, 2-heptanol, 3-heptanol, 2-methyl-1-hexanol, 2-methyl-2-hexanol, 2-methyl-3-hexanol, 5-methyl-2-hexanol, 3-ethyl-3-pentanol, 2,2-dimethyl-3-pentanol, 2,3-dimethyl-3-pentanol, 2,4-dimethyl-3-pentanol, 4,4-dimethyl-2-pentanol, 3-methyl-1-hexanol, 4-methyl-1-hexanol, 5-methyl-1-hexanol, 2-ethylpentanol), octanol (1-octanol, 2-octanol, 3-octanol, 4-methyl-3-heptanol, 6-methyl-2-heptanol, 2-ethyl-1-hexanol, 2-propyl-1-pentanol, 2,4,4-trimethyl-1-pentanol, 3,5-dimethyl-1-hexanol, 2-methyl-1-heptanol, 2,2-dimethyl-1-hexanol), nonanol (1-nonanol, 2-nonanol, 3,5,5-trimethyl-1-hexanol, 2,6-dimethyl-4-heptanol, 3-ethyl-2,2-dimethyl-3-pentanol, 5-methyloctanol, etc.), decanol (1-decanol, 2-decanol, 4-decanol, 3,7-dimethyl-1-octanol, 2,4,6-trimethylheptanol, etc.), undecanol, dodecanol, tridecanol, tetradecanol, pentadecanol, hexadecanol, heptadecanol, octadecanol (stearyl alcohol, etc.), nonadecanol, eicosanol, heneicosanol, tricosanol, tetracosanol; monohydric alkenyl alcohols having from 2 to 40 carbon atoms (in which the alkenyl group may be linear or branched and the double bond may be in any desired position) such as ethenol, propenol, butenol, hexenol, octenol, decenol, dodecenol, octadecenol (oleyl alcohol, etc.); monohydric (alkyl)cycloalkyl alcohols having from 3 to 40 carbon atoms (in which the alkyl group may be linear or branched, and the alkyl group and the hydroxyl group may be in any desired position) such as cyclopentanol, cyclohexanol, cycloheptanol, cyclooctanol, methylcyclopentanol, methylcyclohexanol, dimethylcyclohexanol, ethylcyclohexanol, propylcyclohexanol, butylcyclohexanol, dimethylcyclohexanol, cyclopentylmethanol, cyclohexylethanol (1-cyclohexylethanol, 2-cyclohexylethanol, etc.), cyclohexylethanol, cyclohexylpropanol (3-cyclohexylpropanol, etc.), cyclohexylbutanol (4-cyclohexylbutanol, etc.) butylcyclohexanol, 3,3,5,5-tetramethylcyclohexanol; (alkyl)aryl alcohols (in which the alkyl group may be linear or branched, and the alkyl group and the hydroxyl group may be in any desired position) such as phenyl alcohol, methylphenyl alcohol (o-cresol, m-cresol, p-cresol), creosol, ethylphenyl alcohol, propylphenyl alcohol, butylphenyl alcohol, butylmethylphenyl alcohol (3-methyl-6-tert-butylphenyl alcohol, etc.), dimethylphenyl alcohol, diethylphenyl alcohol, dibutylphenyl alcohol (2,6-di-tert-butylphenyl alcohol, 2,4-di-tert-butylphenyl alcohol, etc.), dibutylmethylphenyl alcohol (2,6-di-tert-butyl-4-methylphenyl alcohol, etc.), dibutylethylphenyl alcohol (2,6-di-tert-butyl-4-ethylphenyl alcohol, etc.), tributylphenyl alcohol (2,4,6-tri-tert-butylphenyl alcohol, etc.), naphthol (α-naphthol, β-naphthol, etc.), dibutylnaphthol (2,4-di-tert-butyl-α-naphthol, etc.); 6-(4-hydroxy-3,5-di-tert-butylanilino)-2,4-bis(n-octylthio)-1,3,5-triazine, and their mixtures.

Of those, more preferred are linear or branched alkyl or alkenyl alcohols having from 12 to 18 carbon atoms such as oleyl alcohol and stearyl alcohol, in that they may more effectively lower the friction between the sliding member coated with the hard carbon (DLC) thin film and the sliding surface of any other material and that they are poorly volatile and therefore may exhibit their friction-reducing effect even at high temperature conditions (for example, sliding condition in an internal combustion engine).

Dialcohols (1.2) are concretely those having two hydroxyl groups in the molecule, including, for example, alkyl or alkenyldiols having from 2 to 40 carbon atoms (in which the alkyl or alkenyl group may be linear or branched, the double bond of the alkenyl group may be in any desired position, and the hydroxyl group may also be in any desired position) such as ethylene glycol, diethylene glycol, polyethylene glycol, propylene glycol, dipropylene glycol, polypropylene glycol, neopentyl glycol, 1,3-propanediol, 1,4-butanediol, 1,2-butanediol, 2-methyl-1,3-propanediol, 1,5-pentanediol, 1,6-hexanediol, 2-ethyl-2-methyl-1,3-propanediol, 2-methyl-2,4-pentanediol, 1,7-heptanediol, 2-methyl-2-propyl-1,3-propanediol, 2,2-diethyl-1,3-propanediol, 1,8-octanediol, 1,9-nonanediol, 2-butyl-2-ethyl-1,3-propanediol, 1,10-decanediol, 1,11-undecanediol, 1,12-dodecanediol, 1,13-tridecanediol, 1,14-tetradecanediol, 1,15-heptadecanediol, 1,16-hexadecanediol, 1,17-heptadecanediol, 1,18-octadecanediol, 1,19-nonadecanediol, 1,20-eicosadecanediol; (alkyl)cycloalkanediols (in which the alkyl group may be linear or branched, and the alkyl group and the hydroxyl group may be in any desired position) such as cyclohexanediol, methylcyclohexanediol; dihydric (alkyl)aryl alcohols having from 2 to 40 carbon atoms (in which the alkyl group may be linear or branched, and the alkyl group and the hydroxyl group may be in any desired position) such as benzenediol (catechol, etc.), methylbenzenediol, ethylbenzenediol, butylbenzenediol (p-tert-butylcatechol, etc.) dibutylbenzenediol (4,6-di-tert-butylresorcinol, etc.), 4,4'-thiobis(3-methyl-6-tert-butylphenol), 4,4'-butylidenebis(3-methyl-6-tert-butylphenol), 2,2'-methylenebis(4-methyl-6-tert-butylphenol), 2,2'-thiobis(4,6-di-tert-butylresorcinol), 2,2'-methylenebis(4-ethyl-6-tert-butylphenol), 4,4'-methylenebis(2,6-di-tert-butylphenol), 2,2'-(3,5-di-tert-butylhydroxy)propane, 4,4'-cyclohexylidenebis(2,6-di-tert-butylphenol); p-tert-butylphenol/formaldehyde condensate, p-tert-butylphenol/acetaldehyde condensate; and their mixtures.

Of those, preferred are ethylene glycol, propylene glycol, neopentyl glycol, 1,4-butanediol, 1,5-pentanediol, neopentyl glycol, 1,6-hexanediol, 2-methyl-2,4-pentanediol, 2-ethyl-2-methyl-1,3-propanediol, 1,7-heptanediol, 1,8-octanediol, 1,9-nonanediol, 1,10-decanediol, 1,11-undecanediol and 1,12-dodecanediol, in that they may more effectively lower the friction between the sliding member coated with the hard carbon thin film and the sliding surface of any other material. In addition, high-molecular-weight hindered alcohols having a molecular weight of at least 300, preferably at least 400 such as 2,6-di-tert-butyl-4-(3,5-di-tert-butyl-4-hydroxybenzyl) phenyl alcohol are also preferred in that they are hardly volatile even at high temperatures (for example, under sliding condition in internal-combustion engines) and are highly resistant to heat, and they can well exhibit their friction-reducing effect and can impart excellent antioxidation stability to lubricating oil.

Tri- and higher polyalcohols are concretely those having three or more hydroxyl groups. In general, tri- to deca-alcohols, preferably tri- to hexa-alcohols are used. Examples of these components are trimethylolalkanes such as glycerin, trimethylolethane, trimethylolpropane, trimethylolbutane; as well as erythritol, pentaerythritol, 1,2,4-butanetriol, 1,3,5-pentanetriol, 1,2,6-hexanetriol, 1,2,3,4-butanetetrol, sorbitol, adonitol, arabitol, xylitol, mannitol; and their polymers or condensates (e.g., glycerin dimers to octamers such as diglycerin, triglycerin, tetraglycerin; trimethylolpropane dimers to octamers such as ditrimethylolpropane; pentaerythritol dimers to tetramers such as dipentaerythritol; sorbitan; condensates such as sorbitol/glycerin condensate (including intramolecular condensates, intermolecular condensates, and self-condensates)).

Saccharides such as xylose, arabitol, ribose, rhamnose, glucose, fructose, galactose, mannose, sorbose, cellobiose, mannose, isomaltose, trehalose and sucrose are also usable.

Of those, more preferred are tri to hexa-alcohols such as glycerin, trimethylolalkanes (e.g., trimethylolethane, trimethylolpropane, trimethylolbutane), pentaerythritol, 1,2,4-butanetriol, 1,3,5-pentanetriol, 1,2,6-hexanetriol, 1,2,3,4-butanetetrol, sorbitol, sorbitan, sorbitol/glycerin condensate, adonitol, arabitol, xylitol, mannitol, and their mixtures; and even more preferred are glycerin, trimethylolethane, trimethylolpropane, pentaerythritol, sorbitan and their mixtures. Especially preferred are polyalcohols having an oxygen content of at least 20%, preferably at least 30%, more preferably at least 40%. Polyalcohols that are higher than hexa-alcohols will too much increase the viscosity of lubricating oil.

The above component 1.4 includes alkylene oxide adducts of alcohols selected from 1.1 to 1.3. Concretely, they are prepared by adding an alkylene oxide having from 2 to 6, preferably from 2 to 4 carbon atoms or its polymer or copolymer to the alcohol to thereby hydrocarbyletherify or hydrocarbylesterify the hydroxyl group of the alcohol. The alkylene oxide having from 2 to 6 carbon atoms includes ethylene oxide, propylene oxide, 1,2-epoxybutane (α-butylene oxide), 2,3-epoxybutane (β-butylene oxide), 1,2-epoxy-1-methylpropane, 1,2-epoxyheptane, 1,2-epoxyhexane. Of those, preferred are ethylene oxide, propylene oxide and butylene oxide, in that they are more effective for reducing friction; and more preferred are ethylene oxide and propylene oxide.

When two or more different types of alkylene oxides are used herein, the mode of oxyalkylene polymerization is not specifically defined, and the groups may be random-copolymerized or block-copolymerized. When an alkylene oxide is added to a polyalcohol having from 2 to 6 hydroxyl groups, it may be added to all the hydroxyl groups of the polyalcohol or may be added to a part of the hydroxyl groups thereof.

The above-mentioned carboxylic acids are compounds represented by the following general formula (2):

R—(COOH)$_n$ (2), for example, a compound containing one or more carboxyl groups.

Examples of carboxylic acids are mentioned below.

2.1 Aliphatic Monocarboxylic Acids (Fatty Acids).

2.2 Aliphatic Polycarboxylic Acids.

2.3 Carbon-Cyclic Carboxylic Acids.

2.4 Heterocyclic Carboxylic Acids.

2.5 Mixtures of Two or More Selected from the Above 2.1 to 2.4.

Aliphatic monocarboxylic acids (fatty acids) are concretely those having one carboxyl group in the molecule, including, for example, saturated aliphatic monocarboxylic acids having from 1 to 40 carbon atoms (in which the saturated aliphatic structure may be linear or branched) such as methanoic acid, ethanoic acid (acetic acid), propanoic acid (propionic acid), butanoic acid (butyric acid, isobutyric acid, etc.), pentanoic acid (valeric acid, isovaleric acid, pivalic acid, etc.), hexanoicacid (caproic acid, etc.), heptanoic acid, octanoicacid (caprylic acid, etc.), nonanoic acid (pelargonic acid, etc.), decanoic acid, undecanoic acid, dodecanoic acid (lauric acid, etc.), tridecanoic acid, tetradecanoic acid (myristic acid, etc.), pentadecanoic acid, hexadecanoic acid (palmitic acid, etc.), heptadecanoic acid, octadecanoic acid (stearic acid, etc.), nonadecanoic acid, eicosanoic acid, heneicosanoic acid, docosanoic acid, tricosanoic acid, tetracosanoic acid, pentacosanoic acid, hexacosanoic acid, heptacosanoic acid, octacosanoic acid, nonacosanoic acid, triacontanoic acid; and unsaturated aliphatic monocarboxylic acids having from 1 to 40 carbon atoms (in which the unsaturated aliphatic structure may be linear or branched, and the unsaturated bond may be in any desired position) such as propenoic acid (acrylic acid, etc.), propynoic acid (propiolic acid, etc.), butenoic acid (methacrylic acid, crotonic acid, isocrotonic acid, etc.), pentenoic acid, hexenoic acid, heptenoic acid, octenoic acid, nonenoic acid, decenoic acid, undecenoic acid, dodecenoic acid, tridecenoic acid, tetradecenoic acid, pentadecenoic acid, hexadecenoic acid, heptadecenoic acid, octadecenoic acid (oleic acid, etc.), nonadecenoic acid, eicosenoic acid, heneicosenoic acid, docosenoic acid, tricosenoic acid, tetracosenoic acid, pentacosenoic acid, hexacosenoic acid, heptacosenoic acid, octacosenoic acid, nonacosenoic acid, triacontenoic acid.

Aliphatic polycarboxylic acids include saturated or unsaturated aliphatic dicarboxylic acids having from 2 to 40 carbon atoms (in which the saturated aliphatic or unsaturated aliphatic structure may be linear or branched, and the unsaturated bond may be in any desired position) such as ethane-diacid (oxalic acid), propane-diacid (malonic acid, etc.), butane-diacid (succinic acid, methylmalonic acid, etc.), pentane-diacid (glutaric acid, ethylmalonic acid, etc.), hexane-diacid (adipic acid, etc.), heptane-diacid (pimelic acid, etc.), octane-diacid (suberic acid, etc.), nonane-diacid (azelaic acid, etc.), decane-diacid (sebacic acid, etc.), propene-diacid, butene-diacid (maleic acid, fumaric acid, etc.), pentene-diacid (citraconic acid, mesaconic acid, etc.), hexene-diacid, heptene-diacid, octene-diacid, nonene-diacid, decene-diacid; saturated or unsaturated tricarboxylic acids (in which the saturated aliphatic or unsaturated aliphatic structure may be linear or branched, and the unsaturated bond may be in any desired position) such as propane-tricarboxylic acid, butane-tricarboxylic acid, pentane-tricarboxylic acid, hexane-tricarboxylic acid, heptane-tricarboxylic acid, octane-tricarboxylic acid, nonane-tricarboxylic acid, decane-tricarboxylic acid; and saturated or unsaturated tetracarboxylic acids (in which the saturated aliphatic or unsaturated aliphatic structure may be linear or branched, and the unsaturated bond may be in any desired position).

Carbon-cyclic carboxylic acids are concretely those having one or more carboxyl groups in the carbon-cyclic molecule, including, for example, naphthene ring-having, mono, di, tri or tetracarboxylic acids having from 3 to 40 carbon atoms (in which the alkyl or alkenyl group, if any therein, may be linear or branched, and the double bond, if any therein, may be in any desired position, and the number and the position of the substituents are not defined) such as cyclohexane-monocarboxylic acid, methylcyclohexane-monocarboxylic acid, ethylcyclohexane-monocarboxylic acid, propylcyclohexane-monocarboxylic acid, butylcyclohexane-monocarboxylic acid, pentylcycohexane-monocarboxylic acid, hexylcyclohexane-monocarboxylic acid, heptylcyclohexane-monocarboxylic acid, octylcyclohexane-monocarboxylic acid, cycloheptane-monocarboxylic acid, cyclooctane-monocarboxylic acid, trimethylcyclopentane-dicarboxylic acid (camphor acid, etc.); aromatic monocarboxylic acids having from 7 to 40 carbon atoms such as benzenecarboxylic acid (benzoic acid), methylbenzenecarboxylic acid (toluic acid, etc.), ethylbenzenecarboxylic acid, propylbenzenecarboxylic acid, benzenedicarboxylic acid (phthalic acid, isophthalic acid, terephthalic acid, etc.), benzenetricarboxylic acid (trimellitic acid, etc.), benzenetetracarboxylic acid (pyromellitic acid, etc.), naphthalenecarboxylic acid (naphthoic acid, etc.); mono, di, tri or tetracarboxylic acids having an aryl group with from 7 to 40 carbon atoms (in which the alkyl or alkenyl group, if any therein as a substituent, may be linear or branched and the double bound, if any therein, may be in any desired position, and the number and the position of the substituents are not defined) such as phenylpropanoic acid (hydroatropic acid), phenylpropenoic acid (atropic acid, cinnamic acid, etc.), salicylic acid, alkylsalicylic acid having one or more alkyl groups with from 1 to 30 carbon atoms.

Heterocyclic carboxylic acids are concretely those having one or more carboxyl groups in the molecule, including, for example, those having from 5 to 40 carbon atoms such as furanecarboxylic acid, thiophenecarboxylic acid, pyridinecarboxylic acid (nicotinic acid, isonicotinic acid, etc.).

The above-mentioned ethers are compounds represented by the following general formula (3):

$$R-(O-R')_n \tag{3}$$

for example, a compound containing one or more ether bonds.

Examples of ethers are mentioned below.

3.1 Saturated or unsaturated aliphatic ethers.

3.2 Aromatic Ethers.

3.3 Cyclic Ethers.

3.4 Mixtures of Two or More Selected from the Above 3.1 to 3.3.

Aliphatic monoethers (saturated or unsaturated aliphatic ethers) are concretely saturated or unsaturated aliphatic ethers having from 1 to 40 carbon atoms (in which the saturated or unsaturated aliphatic structure may be linear or branched, and the unsaturated bond may be in any desired position) such as dimethyl ether, diethyl ether, di-n-propyl ether, diisopropyl ether, dibutyl ether, diisobutyl ether, di-n-amyl ether, diisoamyl ether, dihexyl ether, diheptyl ether, dioctyl ether, dinonyl ether, didecyl ether, diundecyl ether, didodecyl ether, ditridecyl ether, ditetradecyl ether, dipentadecyl ether, dihexadecyl ether, diheptadecyl ether, dioctadecyl ether, dinonadecyl ether, dieicosyl ether, methyl ethyl ether, methyl n-propyl ether, methyl isopropyl ether, methyl isobutyl ether, methyl tert-butyl ether, methyl n-amyl ether, methyl isoamyl ether, ethyl n-propyl ether, ethyl isopropyl ether, ethyl isobutyl ether, ethyl tert-butyl ether, ethyl n-amyl ether, ethyl isoamyl ether, divinyl ether, diallyl ether, methyl vinyl ether, methyl allyl ether, ethyl vinyl ether, ethyl allyl ether.

Concretely, aromatic ethers include, for example, anisole, phenetole, phenyl ether, benzyl ether, phenyl benzyl ether, α-naphthyl ether, β-naphthyl ether, polyphenyl ether, perfluoroether; and these may have a saturated or unsaturated group (in which the saturated or unsaturated group may be linear or branched, and the unsaturated bond may be in any desired position, and the number and the position of the substituents are not defined). Preferably, these are liquid under the service condition thereof, especially at room temperature.

Concretely, cyclic ethers are those having from 2 to 40 carbon atoms, including, for example, ethylene oxide, propylene oxide, trimethylene oxide, tetrahydrofuran, tetrahydropyran, dioxane, glycidyl ether; and these may have a saturated or unsaturated group, a carbon ring, or a saturated or unsaturated aliphatic group-having carbon ring (in which the saturated or unsaturated group may be linear or branched, and the unsaturated bond may be in any desired position, and the number and the position of the substituents are not defined).

The above-mentioned esters are compounds represented by the following general formula (4):

$$R-(COO-R')_n \tag{4}$$

for example, a compound containing one or more ester bonds.
Examples of esters are mentioned below.

4.1 Esters of Aliphatic Monocarboxylic Acids (Fatty Acids).

4.2 Esters of Aliphatic Polycarboxylic Acids.

4.3 Esters of Carbon-Cyclic Carboxylic Acids.

4.4 Esters of Heterocyclic Carboxylic Acids.

4.5 Alkylene Oxide Adducts of Alcohols or Esters.

4.6 Mixtures of Any Compounds selected from the above 4.1 to 4.5.

Esters of the above 4.1 to 4.5 may be complete esters in which the hydroxyl group and the carboxyl group are all esterified, or partial esters in which the hydroxyl group or the carboxyl group partially remains as such.

The component of the above 4.1 is an ester of one or more selected from the above-mentioned aliphatic monocarboxylic acids (fatty acids) and one or more selected from the above-mentioned mono, di, tri or higher polyalcohols, and it includes a fatty acid ester ashless friction modifier. The fatty acid ester ashless friction modifier is a fatty acid ester having a linear or branched hydrocarbon group with from 6 to 30, preferably from 8 to 24, more preferably from 10 to 20 carbon atoms, and it includes esters of fatty acids having such a hydrocarbon group and aliphatic mono alcohols or aliphatic polyalcohols. The fatty acids as referred to herein are aliphatic monocarboxylic acids. Concretely, preferred examples of the esters are glycerin monooleate, glycerin dioleate, sorbitan monooleate, sorbitan dioleate, and the like. In the present invention, the fatty acid ester ashless friction modifier may be excluded.

The component 4.1 except the fatty acid ester ashless friction modifier includes fatty acid esters having a linear or branched hydrocarbon group with from 1 to 5 or from 31 to 40 carbon atoms. Their examples are esters of fatty acids having such a hydrocarbon group and aliphatic monoalcohols or aliphatic polyalcohols.

Of the above, those having a kinematic viscosity at 100° C. of from 1 to 100 mm$^2$/sec may be used for the base oil for lubricating oil, and are generally differentiated from the above-mentioned fatty acid ester ashless friction modifier. Their examples are polyol esters such as single esters or complex esters that are formed of tri or higher polyols having from 3 to 40, preferably from 4 to 18, more preferably from 4 to 12 carbon atoms, especially tri or higher polyols having a neopentyl structure, and one or more selected from monocarboxylic acids having from 1 to 40, preferably from 4 to 18, more preferably from 6 to 12 carbon atoms, and their mixtures, as well as their adducts with alkylene oxides added thereto, for example, trimethylolpropane caprylate, trimethylolpropane pelargonate, pentaerythritol 2-ethylhexanoate, pentaerythritol pelargonate. These may be complete esters in which the hydroxyl group and the carboxyl group are all esterified, or partial esters in which the hydroxyl group or the carboxyl group partly remains as such. However, they are preferably complete esters. The hydroxyl value of the esters is generally at most 100 mg KOH/g, preferably at most 50 mg KOH/g, more preferably at most 10 mg KOH/g.

Preferably, the kinematic viscosity at 100° C. of the base oil for lubricating oil is from 2 to 60 mm$^2$/sec, more preferably from 3 to 50 mm$^2$/sec.

The component 4.2 is an ester of one or more selected from the above-mentioned aliphatic polycarboxylic acids and one or more selected from the above-mentioned mono, di, tri or higher polyalcohols. Its preferred examples are diesters of one or more polycarboxylic acid selected from dicarboxylic acids having from 2 to 40, preferably from 4 to 18, more preferably from 6 to 12 carbon atoms, and one or more selected from monoalcohols having from 4 to 40, preferably from 4 to 18, more preferably from 6 to 14, such as dibutyl maleate, ditridecyl glutamate, di-2-ethylhexyl adipate, diisodecyl adipate, ditridecyl adipate, di-2-ethylhexyl sebacate, and copolymers of these diesters (e.g., dibutyl maleate) and poly-α-olefins having from 4 to 16 carbon atoms; and esters of α-olefin adducts to acetic anhydride or the like, and alcohols having from 1 to 40 carbon atoms. Of the compounds, those having a kinematic viscosity at 100° C. of from 1 to 100 mm$^2$/sec may be used for the base oil for lubricating oil.

The component 4.3 is an ester of one or more selected from the above-mentioned carbon-cyclic carboxylic acids, and one or more selected from the above-mentioned mono, di, tri or higher polyalcohols. Its preferred examples are aromatic carboxylic acid ester such as phthalic acid ester, trimellitic acid ester, pyromellitic acid ester, salicylic acid ester. Of the esters, those having a kinematic viscosity at 100° C. of from 1 to 100 mm$^2$/sec may be used for the base oil for lubricating oil.

The component 4.4 is an ester of one or more selected from the above-mentioned heterocyclic carboxylic acids, and one or more selected from the above-mentioned mono, di, tri or higher polyalcohols. Of the esters, those having a kinematic viscosity at 100° C. of from 1 to 100 mm$^2$/sec may be used for the base oil for lubricating oil.

The component 4.5 includes esters prepared by adding an alkylene oxide to one or more selected from the above-mentioned mono, di, tri or higher polyalcohols followed by esterifying them; and adducts prepared by adding an alkylene oxide to the esters selected from the above-mentioned components 4.1 to 4.4. Of the compounds, those having a kinematic viscosity at 100° C. of from 1 to 100 mm$^2$/sec may be used for the base oil for lubricating oil.

The ketones are compounds represented by the following general formula (5):

$$R\text{—}(CO\text{—}R')_n \tag{5}$$

for example, a compound containing one or more carbonyl bonds.

Specific examples of the aforementioned ketones include:

5.1 A Saturated or Unsaturated Aliphatic Ketone;

5.2 A Carbon-Ring Ketone;

5.3 A Heterocyclic Ketone;

5.4 A Ketone Alcohol;

5.5 A Ketone Acid;

5.6 A Mixture of Two or More Selected from Ketones of the Aforementioned Five Types.

The saturated or unsaturated aliphatic ketone (5.1) can specifically be a saturated or unsaturated aliphatic ketone with 1 to 40 carbon atoms (which may be linear or ramified or branched and may have an unsaturated bond in an arbitrary position), such as acetone, methyl ethyl ketone, methyl propyl ketone, methyl isopropyl ketone, methyl butyl ketone, methyl isobutyl ketone, pinacolone, diethyl ketone, butyrone, diisopropyl ketone, methyl vinyl ketone, mesityl oxide or methyl heptenone.

Also the carbon-ring ketone (5.2) can specifically be a carbon-ring ketone with 1 to 40 carbon atoms such as cyclobutanone, cyclopentanone, cyclohexanone, acetophenone, propiophenone, butyrophenone, valerophenone, benzophenone, dibenzylketone or 2-acetonaphthone, which may have a saturated or unsaturated aliphatic group (that may be linear or ramified, arbitrary in the position of an unsaturated bond and also arbitrary in the position and number of substitution).

Also the heterocyclic ketone (5.3) can specifically be a carbocyclic ketone with 1 to 40 carbon atoms such as acetothienone or 2-acetofuron, which may have a saturated or unsaturated aliphatic group (that may be linear or ramified, arbitrary in the position of an unsaturated bond and also arbitrary in the position and number of substitution).

Also the ketone alcohol (ketol) (5.4) can specifically be a ketone alcohol with 1 to 40 carbon atoms such as acetol, acetoin, acetoethyl alcohol, diacetone alcohol, phenacyl alcohol or benzoin, which may have a carbon ring or a hetero ring (heterocycle) or may have a carbon ring or a hetero ring having a saturated or unsaturated aliphatic group (that may be linear or ramified, arbitrary in the position of an unsaturated bond and also arbitrary in the position and number of substitution).

Also the ketone acid (5.5) can specifically be a ketone acid with 1 to 40 carbon atoms for example an α-ketone acid such as piruvic acid, benzoylformic acid, or phenylpiruvic acid, a β-ketone acid such as acetoacetic acid, propionylacetic acid or benzoylacetic acid, or a γ-ketone acid such as levulinic acid or β-benzoylpropionic acid.

The aldehydes are organic oxygen-containing compounds represented by the following general formula (6):

$$R(CHO)_n \qquad (6),$$

for example, a compound having one or two aldehyde groups.

Specific examples of the aforementioned aldehydes include:

6.1 A Saturated or Unsaturated Aliphatic Aldehyde;

6.2 A Carbon-Ring Aldehyde;

6.3 A Heterocyclic Aldehyde;

6.4 A Mixture of Two or More Selected from the Aldehydes of the Aforementioned Three Types.

The saturated or unsaturated aliphatic aldehyde (6.1) can specifically be a saturated or unsaturated aliphatic aldehyde with 1 to 40 carbon atoms (such saturated or unsaturated aliphatic structure may be linear or ramified with an arbitrary position in an unsaturated bond) such as formaldehyde, acetaldehyde, propionaldehyde, butyl aldehyde, isobutyl aldehyde, valeric aldehyde, isovaleric aldehyde, pivalic aldehyde, caproic aldehyde, heptonic aldehyde, capryl aldehyde, peralgonic aldehyde, capric aldehyde, undecyl aldehyde, lauric aldehyde, tridecyl aldehyde, myristic aldehyde, pentadecyl aldehyde, palmitic aldehyde, margaric aldehyde, stearic aldehyde, acrolein, crotonic aldehyde, propionic aldehyde, glyoxal or succinic aldehyde.

The carbon-ring aldehyde (6.2) can specifically be a carbon-ring aldehyde with 1 to 40 carbon atoms such as benzaldehyde, o-toluic aldehyde, m-toluic aldehyde, p-toluic aldehyde, salicyl aldehyde, cinnamic aldehyde, α-naphthoic aldehyde, or β-naphthoic aldehyde, which may have a saturated or unsaturated aliphatic group (that may be linear or ramified, arbitrary in the position of an unsaturated bond and also arbitrary in the position and number of substitution).

The heterocyclic aldehyde (6.3) can specifically be a heterocyclic aldehyde with 1 to 40 carbon atoms such as furfural, which may have a saturated or unsaturated aliphatic group (that may be linear or ramified, arbitrary in the position of an unsaturated bond and also arbitrary in the position and number of substitution).

The carbonates are organic oxygen-containing compounds represented by the following general formula (7):

$$R\text{—}(O\text{—}COO\text{—}R')_n \qquad (7),$$

for example, a compound having one or two carbonate bonds.

The carbonates can specifically be a carbonate with 1 to 40 carbon atoms having a saturated or unsaturated aliphatic group, a carbon-ring group, a carbon-ring group having a saturated or unsaturated aliphatic group, or a saturated or unsaturated aliphatic group having a carbon-ring group (such saturated or unsaturated aliphatic group being linear or ramified, arbitrary in the position of an unsaturated bond and also arbitrary in the position and number of substitution), such as dimethyl carbonate, diethyl carbonate, di-n-propyl carbonate, diisopropyl carbonate, di-n-butyl carbonate, diisobutyl carbonate, di-tert-butyl carbonate, dipentyl carbonate, dihexyl carbonate, diheptyl carbonate, dioctyl carbonate, dinonyl carbonate, didecyl carbonate, diundecyl carbonate, didodecyl carbonate, ditridecyl carbonate, ditetradecyl carbonate, dipentadecyl carbonate, dihexadecyl carbonate, diheptadecyl carbonate, dioctadecyl carbonate, or diphenyl carbonate, or a hydroxy(poly)oxyalkylene carbonate formed by adding an alkylene oxide to such carbonate.

Also derivatives of the aforementioned organic oxygen-containing compounds (alcohols, carboxylic acids, esters, ethers, ketones, aldehydes and carbonates) are for example a compound obtained by reacting the aforementioned organic oxygen-containing compound with a nitrogen-containing compound, a phosphorus-containing compound, sulfur or a sulfur-containing compound, a boron-containing compound, a halogen element or a halogen-containing compound, a metal element or a metal-containing compound (organic or inorganic), but is not limited to such examples. The aforementioned compound used for obtaining the derivative is usually employed as an additive, but its effect is not particularly restricted when employed in a base oil.

On the other hand, R and R' in the general formula (1)-(7) each independently represents a hydrocarbon group such as an alkyl group, an alkenyl group, an alkylene group, a cycloalkyl group, an alkylcycloalkyl group, an aryl group, an alkylaryl group, or an arylalkyl group (such hydrocarbon group may further contain one or more kinds of group or bond selected from a hydroxyl group, a carboxyl group, a carbonyl group, an ester bond and an ether bond, and may further contain an element other than carbon, hydrogen and oxygen, such as nitrogen or sulfur (for example a heterocyclic compound), a halogen (such as fluorine or chlorine), phosphorus, boron or a metal).

The hydrocarbon group is not particularly restricted in the number of carbon atoms, but preferably has 1 to 40 carbon atoms, more preferably 2 to 30 carbon atoms and particularly preferably 3 to 20 carbon atoms. In case that hydrocarbon group further contains hydroxyl group and/or carboxyl group as mentioned above, the content of hydroxyl group and/or carboxyl group is not particularly limited, but is preferably 10 to 1000 ppm based on the total amount of the composition (for example, lubricating oil).

Examples of the alkyl group include an alkyl group with 1 to 40 carbon atoms such as a methyl group, an ethyl group, an n-propyl group, an isopropyl group, an n-butyl group, an isobutyl group, a sec-butyl group, a tert-butyl group, a linear or ramified pentyl group, a linear or ramified hexyl group, a linear or ramified heptyl group, a linear or ramified octyl group, a linear or ramified nonyl group, a linear or ramified decyl group, a linear or ramified undecyl group, a linear or ramified dodecyl group, a linear or ramified tridecyl group, a linear or ramified tetradecyl group, a linear or ramified pentadecyl group, a linear or ramified hexadecyl group, a linear or ramified heptadecyl group, a linear or ramified octadecyl group, a linear or ramified nonadecyl group, a linear or ramified icosyl group, a linear or ramified henicosyl group, a linear or ramified docosyl group, a linear or ramified tricosyl group, or a linear or ramified tetracosyl group, preferably an alkyl group with 2 to 30 carbon atoms and particularly preferably an alkyl group with 3 to 20 carbon atoms.

Examples of the alkenyl group include an alkenyl group with 2 to 40 carbon atoms such as a vinyl group, a linear or ramified propenyl group, a linear or ramified butenyl group, a linear or ramified pentenyl group, a linear or ramified hexenyl group, a linear or ramified heptenyl group, a linear or ramified octenyl group, a linear or ramified nonenyl group, a linear or ramified decenyl group, a linear or ramified undecenyl group, a linear or ramified dodecenyl group, a linear or ramified tridecenyl group, a linear or ramified tetradecenyl group, a linear or ramified pentadecenyl group, a linear or ramified hexadecenyl group, a linear or ramified heptadecenyl group, a linear or ramified octadecenyl group, a linear or ramified nonadecenyl group, a linear or ramified icosenyl group, a linear or ramified henicosenyl group, a linear orramified docosenyl group, alinear or ramified tricosenyl group, or a linear or ramified tetracosenyl group, preferably an alkenyl group with 2 to 30 carbon atoms and particularly preferably an alkenyl group with 3 to 20 carbon atoms.

Examples of the cycloalkyl group include a cycloalkyl group with 3 to 40 carbon atoms such as a cyclopentyl group, a cyclohexyl group, a cycloheptyl group or a cyclooctyl group, preferably a cycloalkyl group with 3 to 20 carbon atoms and particularly preferably a cycloalkyl group with 5 to 8 carbon atoms.

Examples of the alkylcycloalkyl group include an alkylcycloalkyl group with 4 to 40 carbon atoms such as a methylcyclopentyl group, a dimethylcyclopentyl group (including all structural isomers), a methylethylcyclopentyl group (including all structural isomers), a diethylcyclopentyl group (including all structural isomers), a methyl cyclohexyl group, a dimethylcyclohexyl group (including all structural isomers), amethylethylcyclohexyl group (including all structural isomers) a diethylcyclohexyl group (including all structural isomers), a methylcycloheptyl group, a dimethylcycloheptyl group (including all structural isomers), a methylethylcycloheptyl group (including all structural isomers), or a diethylcycloheptyl group (including all structural isomers), preferably an alkylcycloalkyl group with 5 to 20 carbon atoms, particularly preferably an alkylcycloalkyl group with 6 to 12 carbon atoms.

Examples of the aryl group include an aryl group with 6 to 20 carbon atoms such as a phenyl group or a naphthyl group, preferably an aryl group with 6 to 10 carbon atoms.

Examples of the alkylaryl group include an alkylaryl group with 7 to 40 carbon atoms for example a mono-substituted phenyl group such as a tolyl group (including all structural isomers), an ethylphenyl group (including all structural isomers), a linear or ramified propylphenyl group (including all structural isomers), a linear or ramified butylphenyl group (including all structural isomers), a linear or ramified pentylphenyl group (including all structural isomers), a linear or ramified hexylphenyl group (including all structural isomers), a linear or ramified heptylphenyl group (including all structural isomers), a linear or ramified octylphenyl group (including all structural isomers), a linear or ramified nonylphenyl group (including all structural isomers), a linear or ramified decylphenyl group (including all structural isomers), a linear or ramified undecylphenyl group (including all structural isomers), or a linear or ramified dodecylphenyl group (including all structural isomers); or an aryl group having two more, same or different linear or ramified alkyl groups such as a xylyl group (including all structural isomers), a diethylphenyl group, a dipropylphenyl group, a 2-methyl-6-tert-butylphenyl group, a 2,6-di-tert-butyl-4-methylphenyl group, or a 2,6-di-tert-butyl-4-(3,5-di-tert-butyl-4-benzyl)phenyl group (alkyl group may further include an aryl group, an alkylaryl group or an arylalkyl group including all structural isomers), preferably an alkylaryl group with 7 to 20 carbon atoms and particularly preferably an alkylaryl group with 7 to 12 carbon atoms.

Also examples of the arylalkyl group include an arylalkyl group with 7 to 40 carbon atoms such as a benzyl group, a phenylethyl group, a phenylpropyl group (including isomers of propyl group), a phenylbutyl group (including isomers of butyl group), a phenylpentyl group (including isomers of pentyl group) or a phenylhexyl group (including isomers of hexyl group), preferably an arylalkyl group with 7 to 20 carbon atoms and particularly preferably an arylalkyl group with 7 to 12 carbon atoms.

Derivatives of the above-mentioned organic oxygen-containing organic compounds can be used like the oxygen-containing organic compounds. The derivatives concretely include, for example, compounds prepared by sulfidizing one selected from the above-mentioned alcohols, carboxylic acids, esters and ethers, ketones, aldehydes and carbonates; compounds prepared by halogenating (fluorinating, chlorinating) the same one; its reaction products with acids, such as sulfuric acid, nitricacid, boricacid, phosphoricacid, ortheirestersormetal salts; and its reaction products with metals, metal-containing compounds or amine compounds.

Of those, preferred are reaction products of one or more selected from alcohols and carboxylic acids and their derivatives, with amine compounds (e.g., Mannich reaction products, acylated products, amides).

The amine compounds as referred to herein include ammonia, monoamines, diamines, and polyamines. More concretely, their examples are ammonia; alkylamines having an alkyl group with from 1 to 30 carbon atoms (in which the alkyl group may be linear or branched) such as methylamine, ethylamine, propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, stearylamine, dimethylamine, diethylamine, dipropylamine, dibutylamine, dipentylamine, dihexylamine, diheptylamine, dioctylamine, dinonylamine, didecylamine, diundecylamine, didodecylamine, ditridecylamine, ditetradecylamine, dipentadecylamine, dihexadecylamine, diheptadecylamine, dioctadecylamine, methylethylamine, methylpropylamine, methylbutylamine, ethylpropylamine, ethylbutylamine, and propylbutylamine; alkenylamines having an alkenyl group with from 2 to 30 carbon atoms (in which the alkenyl group may be linear or branched) such as ethenylamine, propenylamine, butenylamine, octenylamine, and oleylamine; alkanolamines having an alkanol group with from 1 to 30 carbon atoms (in which the alnanol group may be linear or branched) such as methanolamine, ethanolamine, propanolamine, butanolamine, pentanolamine, hexanolamine, heptanolamine, octanolamine, nonanolamine, methanolethanolamine, methanolpropanolamine, methanolbutanolamine, ethanolpropanolamine, ethanolbutanolamine, and propanolbutanolamine; alkylenediamines having an alkylene group with from 1 to 30 carbon atoms, such as methylenediamine, ethylenediamine, propylenediamine, and butylenediamine; polyamines such as diethylenetriamine, triethylene-tetramine, tetraethylenepentamine, pentaethylenehexamine; compounds derived from the above-mentioned monoamines, diamines or polyamines and further having an alkyl or alkenyl group with from 8 to 20 carbon atoms, such as undecyldiethylamine, undecyldiethanolamine, dodecyldipropanolamine, oleyldiethanolamine, oleylpropylenediamine, stearyltetraethylenepentamine; heterocyclic compounds such as N-hydroxyethyloleylimidazoline; alkylene oxide adducts of these compounds; and their mixtures.

Of those nitrogen-containing compounds, preferred are aliphatic amines having an alkyl or alkenyl group with from 10 to 20 carbon atoms (these may be linear or branched) such as decylamine, dodecylamine, tridecylamine, heptadecylamine, octadecylamine, oleylamine and stearylamine.

Of the derivatives of these oxygen-containing organic compounds, preferred are carbonamides having from 8 to 20 carbon atoms such as oleamide.

While the aforementioned organic oxygen-containing compound can exhibit an extremely excellent low-friction property by being singly used (namely by 100%) in a sliding surface site constituted by the sliding members, lubrication may also be achieved by providing such a sliding surface site with a lubricant prepared by adding a medium (such as lubricating oil) to the organic oxygen-containing compound. It will be understood that a high friction reducing effect can be obtained even by providing such a sliding surface site with an aqueous solution containing the organic oxygen-containing compound.

Examples of the medium are mineral oil, synthetic oil, natural oil or fat, diluting oil, grease, wax, a hydrocarbon solvent, a non-hydrocarbon organic solvent other than the hydrocarbon solvent, water, or a mixture thereof, particularly a medium showing a liquid state, a grease state or a wax state in a sliding condition or at the normal temperature. A content of the organic oxygen-containing compound in such a medium is not particularly restricted, but a lower limit value is usually 0.001%, preferably 0.05% and further preferably 0.1%, and the content may exceed 3.0%. Also an upper limit value is 100% as described above, but is preferably 50%, more preferably 20%, further preferably 10% and particularly 5%, and an excellent low-friction characteristics can be exhibited even at an addition of a small amount such as 0.1 to 2%.

As the medium, there is particularly preferably employed a lubricating oil base oil (a base oil of the lubricating oil). Such lubricating oil base oil is not particularly limited and any ordinary base oil, either mineral oil type or synthetic type, for lubricant composition can be employed.

Examples of the lubricating oil base oil of mineral oil type include a product formed by subjecting a lubricant fraction, obtained by normal pressure distillation or reduced pressure distillation of crude oil, to at least one of solvent deasphalting, solvent extraction, hydrogenolysis, solvent dewaxing, hydrogenating purification and wax isomerization, particularly a base oil subjected to hydrogenolysis, hydrogenating purification or wax isomerization. Among such products, there is preferred a mineral oil obtained by hydrogenating purification or hydrogenolysis, or an isoparaffinic mineral oil obtained by isomerization of GTL (gas-to-liquid) wax by a Fischer-Tropsche process or of normal paraffin-rich wax obtained in a dewaxing step of lubricant oil.

Examples of the lubricating oil base oil of synthetic type include an alkylnaphthalene, an alkylbenzene, a polybutene and a hydrogenated product thereof; a poly-α-olefin such as a 1-octene oligomer, a 1-decene oligomer or a hydrogenated product thereof; the above-mentioned ester having a dynamic viscosity of 1 to 100 mm$^2$/s at 100° C., described in the foregoing; and a mixture thereof. Preferred examples of the lubricating oil base oil of synthetic type other than such ester include a poly-α-olefin such as a 1-octene oligomer, a 1-decene oligomer and a hydrogenated product thereof. Also as the ester, a polyol ester is particularly preferable.

In addition to the use of the lubricating oil base oil of mineral oil type or the lubricating oil base oil of synthetic type either singly or as a mixture, it is also possible to use a mixture of two or more kinds of the base oil of mineral oil type or the base oil of synthetic type. Also in such mixture, a mixing ratio of two or more kinds of the base oils is not particularly restricted and can be selected arbitrarily.

A total aromatic content of the lubricating oil base oil is not particularly restricted, but is preferably 15% or less, more preferably 10% or less and further preferably 8%. A total aromatic content in the lubricating oil base oil exceeding 15% results in an inferior stability to oxidation and is undesirable. A composition of a high friction reducing effect can be obtained even with a total aromatic content in the lubricating oil base oil of 2% or less, or even 0%, for example in an ester lubricating oil base oil such as a highly hydrogenolyzed mineral oil, a wax isomerized mineral oil, a poly-α-olefin or a hydrogenated product, a hydrogenated product of 1-decene oligomer, polyole ester, or a mixture thereof. In case the content of the organic oxygen-containing compound (excluding esters as the lubricating oil base oil) exceeds 2%, since the storage stability may be deteriorated, it is preferable, if necessary, to regulate the total aromatic content (for example at 2% or higher) of the lubricating oil base oil by blending a solvent purified mineral oil or an alkylbenzene, or to employ an ester as the lubricating oil base oil. The "total aromatic content" means a content of an aromatic fraction measured according to ASTM D2549, and such aromatic fraction ordinarily contains alkylbenzenes, alkylnaphthalenes, anthracene, phenanthrene, alkylated substances thereof, a compound in which four or more benzene rings are condensed, and compounds containing heteroaromatic structure such as pyridines, quinolines, phenols and naphthols.

Also the lubricating oil base oil is not particularly restricted in a dynamic viscosity thereof, but in case of use as a lubricant composition for an internal combustion engine, a dynamic viscosity at 100° C. is preferably 2 mm$^2$/s or higher, and more preferably 3 mm$^2$/s or higher. Also an upper limit is preferably 20 mm$^2$/s or less, more preferably 10 mm$^2$/s or less and particularly preferably 8 mm$^2$/s or less. A lubricating oil base oil with a dynamic viscosity at 100° C. of 2 mm$^2$/s or higher allows to obtain a composition capable of sufficient oil film formation, an excellent lubricating property and a smaller evaporation loss of the base oil under a high temperature condition. On the other hand, a dynamic viscosity at 100° C. of 20 mm$^2$/s or less reduces a fluid resistance, thereby allowing to obtain a composition with a smaller frictional resistance in a lubricated site.

Furthermore, a viscosity index of the lubricating oil base oil is not particularly restricted but is preferably 80 or higher, and, in case of use as a lubricant composition for an internal combustion engine, it is preferably 100 or higher, more preferably 120 or higher, and may be within a range of 140 to 250. A lubricating oil base oil of a high viscosity index allows to obtain a composition excellent not only in a low-temperature viscosity characteristics but also in a friction reducing effect.

The lubricating oil may further include an ashless dispersant, an abrasion preventing agent or extreme pressure agent, a metal-based cleaning agent, an antioxidant, a viscosity index improving agent, another friction modifier, an antirusting agent, a nonionic surfactant, an antiemulsification agent, a metal deactivator, or a defoaming agent singly or in a combination of plural kinds, for improving required performances.

As the ashless dispersant, various known ashless dispersants can be employed. For example polybutenylsuccinimide or a derivative thereof can be advantageously employed.

Specific examples of the polybutenyl succinimide usable in connection with the present invention include compounds represented by the following general formulas (1) and (2).

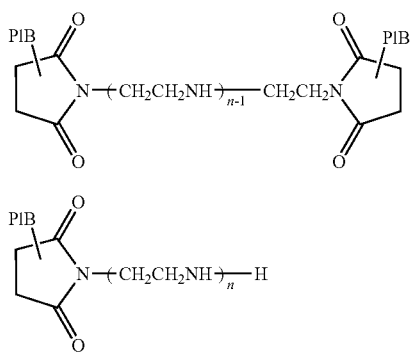

In each of the formulas (1) and (2), n represents an integer of 1 to 5, preferably 2 to 4, so as to attain a good detergent effect. Further, PIB represents a polybutenyl group derived from polybutene. The polybutene can be prepared by polymerizing high-purity isobutene or a mixture of 1-butene and isobutene in the presence of a boron fluoride catalyst or an aluminum chloride catalyst in such a manner that the polybutene attains a number-average molecular weight of 900 to 3,500, preferably 1,000 to 2,000. When the number-average molecular weight of the polybutene is less than 900, there is a possibility of failing to attain a sufficient detergent effect. When the number-average molecular weight of the polybutene exceeds 3,500, the polybutene may undesirably deteriorate in low-temperature fluidity. In the production of the polybutenyl succinimide, the polybutene may be used after purified by removing trace amounts of fluorine and chlorine residues, which result from the above polybutene production catalyst, by any suitable treatment (such as adsorption process or washing process). The amount of the fluorine and chlorine residues is preferably controlled to 50 ppm or less, more preferably 10 ppm or less, most preferably 1 ppm or less.

The production method of the polybutenyl succinimide is not particularly restricted. For example, the polybutenyl succinimide can be prepared by reacting an chloride of the above-mentioned polybutene, or the polybutene from which fluorine and chlorine residues are removed, with maleic anhydride at 100 to 200° C. to form polybutenyl succinate, and then, reacting the thus-formed polybutenyl succinate with polyamine (such as diethylene triamine, triethylene tetramine, tetraethylene pentamine or pentaethylene hexamine).

The polybutenyl succinimide derivative can be exemplified by boron- and acid-modified compounds obtained by reacting the polybutenyl succinimide of the formulas (1) and (2) with boron compounds or oxygen-containing organic compounds so as to neutralize or amidate the whole or part of the remaining amino and/or imide groups. Among these, boron-containing polybutenyl succinimide, especially boron-containing bis (polybutenyl)succinimide, is more preferably used.

The above boron compound can be a boric acid, a borate or a boric acid ester. Specific examples of the boric acid include orthoboric acid, metaboric acid and paraboric acid. Specific examples of the borate include: ammonium salts including ammonium borates, such as ammonium metaborate, ammonium tetraborate, ammonium pentaborate and ammonium octaborate. Specific examples of the boric acid ester include: esters of boric acids and alkylalcohols (preferably $C_1$-$C_6$ alkylalcohols), such as monomethyl borate, dimethyl borate, trimethyl borate, monoethyl borate, diethyl borate, triethyl borate, monopropyl borate, dipropyl borate, tripropyl borate, monobutyl borate, dibutyl borate and tributyl borate. Herein, the content ratio of nitrogen to boron (B/N) by mass in the boron-containing polybutenyl succinimide is usually 0.1 to 3, preferably 0.2 to 1.

The above oxygen-containing organic compound can be exemplified by: $C_1$-$C_{30}$ monocarboxylic acids, such as formic acid, acetic acid, glycolic acid, propionic acid, lactic acid, butyric acid, valeric acid, caproic acid, enanthic acid, caprylic acid, pelargonic acid, capric acid, undecylic acid, lauric acid, tridecanoic acid, myristic acid, pentadecanoic acid, palmitic acid, margaric acid, stearic acid, oleic acid, nonadecanoic acid and eicosanoic acid; $C_2$-$C_{30}$ polycarboxylic acids, such as oxalic acid, phthalic acid, trimellitic acid and pyromellitic acid, and anhydrides and esters thereof; $C_2$-$C_6$ alkylene oxides; and hydroxy(poly)oxyalkylene carbonates.

The amount of the polybutenyl succinimide and/or the derivative thereof added in the medium (for example, lubricating oil) is not particularly restricted, and is preferably 0.1 to 15%, more preferably 1.0 to 12%, based on the total mass of the lubricating oil. When the amount of the polybutenyl succineimide and/or the derivative thereof is less than 0.1%, there arises a possibility of failing to attain a sufficient detergent effect. It becomes uneconomical when the amount of the polybutenyl succineimide and/or the derivative thereof exceeds 15%. In addition, such a large amount of the polybutenyl succineimide and/or the derivative thereof tends to cause a deterioration in demulsification ability.

The ashless dispersant other than the above-mentioned polybutenyl succinimide and/or the derivative thereof can be exemplified by polybutenylbenzylamines and polybutenylamines each having polybutenyl groups of number-average molecular weight of 900 to 3,500, polybutenyl succinimides having polybutenyl groups of number-average molecular weight of less than 900 and derivatives thereof.

As antioxidant and anti-wear agent, known compounds may be mixed with the organic oxygen-containing compound or the medium containing the organic oxygen-containing compound. A preferable example of the antioxidant and anti-wear agent is zinc dithiophosphate represented by the following general formula (3):

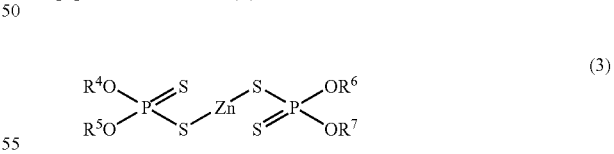

In the general formula (3), $R^4$, $R^5$, $R^6$ and $R^7$ each represent $C_1$-$C_{24}$ hydrocarbon groups. The $C_1$-$C_{24}$ hydrocarbon group is preferably a $C_1$-$C_{24}$ straight-chain or branched-chain alkyl group, a $C_3$-$C_{24}$ straight-chain or branched-chain alkenyl group, a $C_5$-$C_{13}$ cycloalkyl or straight-chain or branched-chain alkylcycloalkyl group, a $C_6$-$C_8$ aryl or straight-chain or branched-chain alkylaryl group, or a $C_7$-$C_{19}$ arylalkyl group. The above alkyl group or alkenyl group can be primary, secondary or tertiary. Specific examples of $R^4$, $R^5$, $R^6$ and $R^7$ include: alkyl groups, such as methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl and tetracosyl; alkenyl groups, such as propenyl, isopropenyl, butenyl, butadienyl, pentenyl, hexenyl, heptenyl, octenyl, nonenyl, decenyl, undecenyl, dodecenyl, tridecenyl, tetradecenyl, pentadecenyl, hexadecenyl, heptadecenyl, octadecenyl (oleyl), nonadecenyl, icosenyl, heneicosenyl, docosenyl, tricosenyl and tetracosenyl; cycloalkyl groups, such as cyclopentyl, cyclohexyl and cycloheptyl; alkylcycloalkyl groups, such as methylcyclopentyl, dimethylcyclopentyl, ethylcyclopentyl, propylcyclopentyl, ethylmethylcyclopentyl, trimethylcyclopentyl, diethylcyclopentyl, ethyldimethylcyclopentyl, propylmethylcyclopentyl, propylethylcyclopentyl, di-propylcyclopentyl, propylethylmethylcyclopentyl, methylcyclohexyl, dimethylcyclohexyl, ethylcyclohexyl, propylcyclohexyl, ethylmethylcyclohexyl, trimethylcyclohexyl, diethylcyclohexyl, ethyldimethylcyclohexyl, propylmethylcyclohexyl, propylethylcyclohexyl, di-propylcyclohexyl, propylethylmethylcyclohexyl, methylcycloheptyl, dimethylcycloheptyl, ethylcycloheptyl, propylcycloheptyl, ethylmethylcycloheptyl, trimethylcycloheptyl, diethylcycloheptyl, ethyldimethylcycloheptyl, propylmethylcycloheptyl, propylethylcycloheptyl, di-propylcycloheptyl and propylethylmethylcycloheptyl; aryl groups, such as phenyl and naphthyl; alkylaryl groups, such as tolyl, xylyl, ethylphenyl, propylphenyl, ethylmethylphenyl, trimethylphenyl, butylphenyl, propylmethylphenyl, diethylphenyl, ethyldimethylphenyl, tetramethylphenyl, pentylphenyl, hexylphenyl, heptylphenyl, octylphenyl, nonylphenyl, decylphenyl, undecylphenyl and dodecylphenyl; and arylalkyl groups, such as benzyl, methylbenzyl, dimethylbenzyl, phenethyl, methylphenethyl and dimethylphenethyl. The above hydrocarbon groups include all possible isomers.

The above-mentioned hydrocarbon groups include all considerable straight or branched chain structures. The position of double bond of alkenyl group, the bonding position of alkyl group to cycloalkyl group and the bonding position of alkyl group to aryl group are free.

Specific examples of the zinc dithiophosphate usable in connection with the present invention include zinc diisopropyldithiophosphate, zinc diisobutyldithiophosphate, zinc di-sec-butyldithiophosphate, zinc di-sec-pentyldithiophosphate, zinc di-n-hexyldithiophosphate, zinc di-sec-hexyldithiophosphate, zinc di-octyldithiophosphate, zinc di-2-ethylhexyldithiophosphate, zinc di-n-decyldithiophosphate, zinc di-n-dodecyldithiophosphate, zinc diisotridecyldithiophosphate and mixtures thereof.

The amount of the zinc dithiophosphate added in the lubricating oil is not particularly restricted. The zinc dithiophosphate is preferably contained in an amount of 0.1% or less, more preferably in an amount of 0.06% or less, most preferably in a minimum effective amount, in terms of the phosphorus element based on the total mass of the lubricating oil in order to produce a higher friction reducing effect. When the amount of the zinc dithiophosphate exceeds 0.1%, there arises a possibility of inhibiting the effect of the ashless fatty acid ester friction modifier and/or the ashless aliphatic amine friction modifier, particularly at a sliding surface (plane) site between the DLC thin film and the opposite member formed of iron-based material.

The zinc dithiophosphate can be prepared by any known method. For example, the zinc dithiophosphate may be prepared by reacting alcohols or phenols having the above $R^4$, $R^5$, $R^6$ and $R^7$ hydrocarbon groups in the above-mentioned chemical formula (3) with phosphorous pentasulfide to form dithiophosphoric acid, and then, neutralizing the thus-formed dithiophosphoric acid with zinc oxide. Here, the molecular structure of zinc dithiophosphate differs according to the alcohols or phenols used as a raw material for the zinc dithiophosphate production.

The other anti-friction agent or extreme-pressure additive can be exemplified by disulfides, sulfurized fats and oils, olefin sulfides, phosphate esters having one to three $C_2$-$C_{20}$ hydrocarbon groups, thiophosphate esters, phosphite esters, thiophosphite esters and amine salts of these esters.

As discussed above, in connection with the present invention, the organic oxygen-containing compound can exhibit an extremely excellent low friction characteristics in case of being used between the sliding surfaces of the sliding members. In order to raise performances required for the organic oxygen-containing compound or the medium containing the organic oxygen-containing compound, it may be mixed with other additives set forth below.

One of the additives is a metallic detergent which can be any metallic-detergent compound commonly used for a lubricating oil. Specific examples of the metallic detergent usable in connection with the present invention include sulfonates, phenates and salicylates of alkali metals or alkali-earth metals; and mixtures of two or more thereof. Examples of the alkali metals include sodium (Na) and potassium (K), and examples of the alkali-earth metals include calcium (Ca) and magnesium (Mg). In connection with the present invention, sodium and calcium sulfonates, sodium and calcium phenates, and sodium and calcium salicylates are suitably used. The total base number and amount of the metallic detergent can be selected in accordance with the lubricating oil performance required. The total base number of the metallic detergent is usually 0 to 500 mgKOH/g, preferably 150 to 400 mgKOH/g, as measured by perchloric acid method according to ISO 3771 "Determination of base number—Perchloric acid potentiometric titration method". The amount of the metallic detergent is usually 0.1 to 10% based on the total mass of the lubricating oil.

Another is an antioxidant which can be any antioxidant compound commonly used for a lubricating oil. Specific examples of the antioxidant usable in connection with the present invention include: phenolic antioxidants, such as 4,4'-methylenebis(2,6-di-tert-butylphenol) and octadecyl-3-(3,5-di-tert-butyl-4-hydroxyphenyl)propionate; amino antioxidants, such as phenyl-α-naphthylamine, alkylphenyl-a-naphthylamine and alkyldiphenylamine; and mixtures of two or more thereof. The amount of the antioxidant is usually 0.01 to 5% based on the total mass of the lubricating oil.

A further one is a viscosity index improver can be exemplified by: non-dispersion type viscosity index improvers, such as copolymers of one or two monomers selected from various methacrylic acids, and hydrides of the copolymers; and dispersion type viscosity index improvers, such as copolymers of methacrylates (including nitrogen compounds). There may be also used, as the viscosity index improver, copolymers of ethylene and α-olefins (such as propylene, 1-butene and 1-pentene) and hydrides thereof, polyisobutylenes and hydrides thereof, a hydrogenated copolymer of styrene and diene, a copolymer of styrene and maleic anhydride and polyalkylstyrenes.

The molecular weight of the viscosity index improver needs to be selected in view of shear stability. For example, the number-average molecular weight of the viscosity index improver is desirably in a range of 5,000 to 1,000,000, more desirably 100,000 to 800,000, for dispersion or non-dispersion type polymethacrylates; in a range of 800 to 5,000 for polyisobutylenes and hydrides thereof; and in a range of 800 to 300,000, more desirably 10,000 to 200,000 for ethylene/α-olefin copolymers and hydrides thereof. The above viscosity index improving compounds can be used alone or in the form of a mixture of two or more thereof. The amount of the viscosity index improver is preferably 0.1 to 40.0% based on the total mass of the lubricating oil.

A further one is another ashless friction modifier other than the above-mentioned ones. The ashless friction modifier can be exemplified by ashless friction modifiers, such as boric acid esters, higher alcohols and aliphatic ethers, and metallic friction modifiers, such as molybdenum dithiophosphate, molybdenum dithiocarbamate and molybdenum disulfide.

A further one is a rust inhibitor which can be exemplified by alkylbenzene sulfonates, dinonylnaphthalene sulfonates, esters of alkenylsuccinic acids and esters of polyhydric alcohols.

A further one is a nonionic surfactant or deemulsifier can be exemplified by nonionic polyalkylene glycol surfactants, such as polyoxyethylene alkylethers, polyoxyethylene alkylphenyleters and polyoxyethylene alkylnaphthyleters.

A further one is a metal deactivator which can be exemplified by imidazoline compounds, pyrimidine derivatives, thiazole and benzotriazole.

A further one is an anti-foaming agent which can be exemplified by silicones, fluorosilicones and fluoroalkylethers.

In case of using the above additives in lubricating oil (composition), the other friction modifier, the rust inhibitor or demulsifier is usually contained in an amount of 0.01 to 5% based on the total mass of the lubricating oil, and the metal deactivator is contained in an amount of 0.0005 to 1% based on the total mass of the lubricating oil.

EXPERIMENT

In the following, the present invention will be further clarified by examples and comparative examples, but the present invention is not limited by such examples.

Examples 1 To 9 And Comparative Examples 1 TO 3

Preparation of Sliding Members (Pin and Disc)

Specimens of the sliding members (pin and disc) for a pin-on-disc (singlebody) friction evaluation test were prepared. The pin-on-disc friction evaluation test was conducted by using a test apparatus whose essential part was shown in FIG. 1, in which three pins and one disc were used for each test.

<Base Material of Pin>

A heat treated SUJ2 material (according to JIS G 4805) was formed into a certain pin shape by grinding, and then the pin shape material was finished into various surface roughness (Ra 0.1 μm or less) by polishing with a lapping tape. Thus, the base material of pin was produced.

<Base Material of Disc>

A disc-shaped material of a heat treated SUJ2 material or another material was subjected to a certain age hardening process, and then a sliding surface in contact with the pin was finished into various surface roughness by polishing. Thus, the base material of disc was produced.

<Surface Treatment>

On a surface of the thus finished pin base material or disc base material, "a-C (a-C type DLC)", "DLC (a-C:H (10 atomic %) type)" or "DLC (a-C:H (20 atomic %) type)" was coated by a PVD process or a CVD process utilizing graphite as a target, thereby forming a coating (hard carbon thin film) on the surface of the base material. The surface of the coating was finished into various surface roughness (Ra 0.1 μm or less) by polishing with a lapping tape:

Thus, the specimens of the pin and the disc for the pin-on-disc friction evaluation test were prepared.

The pin and the disc were subjected to measurements to obtain the thickness of the coating (indicated as "Film thickness"), the surface hardness (Hv) and the surface roughness (Ra) as shown in Table 1.

The specification of the sliding members and the results of the measurements are shown in Table 1. In Table 1, "Ex." indicates Example; and "Comp. Ex." indicates Comparative Example.

[Preparation of Lubricating Oil]

(a) One mass % of GMO (glycerol monooleate), ether (monooleylglycerylether), amide (oleylamide) or amine was added as a friction modifier to PAO (poly alpha-olefin) to prepare lubricating oils for Examples 1, 2, 4 to 9.

(b) Glycerol was used as lubricating oil for Example 3.

(c) Lubricating oil (SAE 5W-30) was used for lubricating oil for Comparative Examples 1 and 2.

(d) PAO was used as lubricating oil for Comparative Example 3.

TABLE 1

| | Sliding members for pin-on-disc friction test | | | | Film thickness μm | | Surface hardness | | Surface roughness Ra μm | | Sample oil | Friction coefficient |
|---|---|---|---|---|---|---|---|---|---|---|---|---|
| | disc | | pin | | | | disc | pin | | | | |
| Example | base material | coating | base material | coating | disc | pin | Hv | Hv | disc | pin | lubricating oil | Friction coefficient |
| Ex. 1 | heat treated SUJ2 | a-C | heat treated SUJ2 | a-C | 1.2 | 1.1 | 1800 | 1850 | 0.03 | 0.03 | PAO + GMO | 0.033 |
| Ex. 2 | heat treated SUJ2 | a-C | heat treated SUJ2 | DLC (a-C:10% H) | 2.0 | 1.8 | 1650 | 1500 | 0.03 | 0.03 | PAO + GMO | 0.065 |
| Ex. 3 | heat treated SUJ2 | a-C | heat treated SUJ2 | none | 1.5 | | 3500 | 750 | 0.05 | 0.05 | glycerol | 0.045 |
| Ex. 4 | heat treated SUJ2 | DLC (a-C:10% H) | heat treated SUJ2 | none | 0.8 | | 1850 | 750 | 0.05 | 0.05 | PAO + GMO | 0.050 |
| Ex. 5 | heat treated SUJ2 | DLC (a-C:20% H) | heat treated SUJ2 | none | 0.3 | | 1350 | 750 | 0.04 | 0.05 | PAO + GMO | 0.047 |
| Ex. 6 | AC2A | none | heat treated SUJ2 | a-C | | 0.8 | 80 | 1550 | 0.05 | 0.02 | PAO + GMO | 0.048 |
| Ex. 7 | AC2A | none | heat treated SUJ2 | a-C | | 1.1 | 80 | 1800 | 0.05 | 0.03 | PAO + ether | 0.041 |
| Ex. 8 | AC8A | none | heat treated SUJ2 | a-C | | 0.9 | 120 | 1750 | 0.05 | 0.10 | PAO + amide | 0.046 |
| Ex. 9 | AC8A | none | heat treated SUJ2 | a-C | | 0.3 | 120 | 1400 | 0.05 | 0.04 | PAO + amine | 0.041 |
| Comp. Ex. 1 | AC2A | none | heat treated SUJ2 | none | | | 750 | 750 | 0.10 | 0.03 | SAE 5W-30 | 0.14 |
| Comp. | AC8A | none | heat treated SUJ2 | none | | 1.1 | 120 | 750 | 0.10 | 0.03 | SAE 5W-30 | 0.068 |

TABLE 1-continued

| Example | Sliding members for pin-on-disc friction test | | | | Film thickness μm | | Surface hardness | | Surface roughness Ra μm | | Sample oil lubricating oil | Friction coefficient |
|---|---|---|---|---|---|---|---|---|---|---|---|---|
| | disc | | pin | | | | | | | | | |
| | base material | coating | base material | coating | disc | pin | disc Hv | pin Hv | disc | pin | | |
| Ex. 2 | | | | | | | | | | | | |
| Comp. Ex. 3 | heat treated SUJ2 | a-C | heat treated SUJ2 | none | 0.8 | 0.8 | 1800 | 750 | 0.05 | 0.03 | PAO | 0.08 |

[Pin-On-Disc Friction Evaluation Test]

Figure 1:
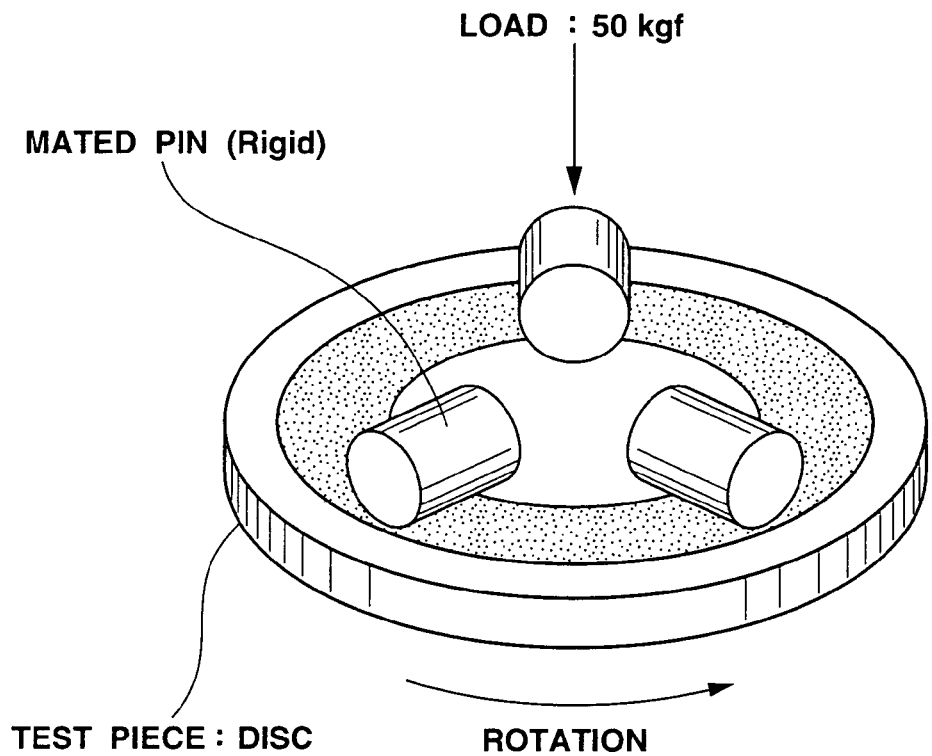
FIG. 1 is a schematic illustration showing an arrangement of sliding members (pins and disc) forming part of a low-friction sliding mechanism according to the present invention, in a pin-on-disc friction evaluation test.

A low-friction sliding mechanism for each example was prepared by combining the sliding members as shown in Table 1 and using the lubricating oil (composition). Thereafter, the pin-on-disc friction evaluation test was conducted on the low-friction sliding mechanism to determine a friction coefficient in the following:

The pins and the disc were arranged as shown in FIG. 1 in which the three pins (indicated as "Mated Pin (Rigid)") were pressed on the disc (indicated as "Test Piece") at a load of 50 Kgf so that the maximum Hertz's contact pressure was 700 MPa for Examples 1 to 5 and Comparative Examples 1 and 3) or 80 MPa for Examples 6 to 9 and Comparative Example 2). Each pin had a diameter of 5 mm and a length of 5 mm. The pins and the disc shown in FIG. 1 were dipped in the lubricating oil in an oil bath at an oil temperature of 80° C. The disc was rotated at a rotational speed of 30 r.p.m. (0.03 m/s) for 60 minutes. Results are shown also in Table 1.

As apparent from Table 1 demonstrating the result of the friction evaluation test for Examples 1 to 9, all the specimens of Examples 1 to 9 exhibited excellent low friction coefficients. For example, according to Examples 1 to 9, about 40% or more of friction reducing effect could be obtained over Comparative Example 1 relating to a combination of steel materials used in general gasoline-fueled engines and over Comparative Example 2 relating to a combination of steel and aluminum alloy. Additionally, according to Examples 1 to 9, about 20% or more of friction reducing effect could be obtained over a case where the DLC material and steel was combined to be in sliding contact with each other in the presence of the lubricating oil PAO containing no organic oxygen-containing compound. Furthermore, the specimens of Examples 1 to 9 had no problem at their sliding surface upon inspection after completion of the friction evaluation test, thereby demonstrating that they were very excellent in wear resistance.

According to Examples 4 and 5, the specimens of Example 5 using the DLC material having a hydrogen content of 20 atomic % was apparently degraded in friction reducing effect as compared with those of Example 4 using the DLC material having a hydrogen content of about 10 atomic % and other Examples using the DLC material of a-C type having substantially no hydrogen content.

Thus, a great friction reducing effect could be obtained in the low-friction sliding mechanisms including the sliding members slidable in presence of the lubricating oils containing the friction modifiers as in Examples 1 to 9. Additionally, it was confirmed that the DLC material of a-C type was appropriate for the material constituting the hard carbon thin film or coating.

While the present invention has been illustrated with reference to Examples and Comparative Examples, it will be understood that the present invention is not limited to those and therefore various changes and modifications may be made in the invention without departing from the spirit and scope of the invention. For example, effects of the present invention may be expected in all mechanical sliding members or parts to which the present invention is applied, and such effects are remarkable friction reducing effects which are in direct connection with improvement in fuel economy of engines.

As appreciated from the above, according to the present invention, the extremely thin tribo-film having certain functional group(s) is formed at the sliding surface of the sliding member when the sliding member is in sliding contact with the sliding surface of an opposite member in presence of the organic oxygen-containing compound. Accordingly, the present invention can provide the low-friction sliding member and the low-friction sliding mechanism exhibiting a low shearing force as compared with conventional sliding members and sliding mechanisms where a film containing $MOS_2$ is formed.

The entire contents of Japanese Patent Applications No. 2003-208278, filed Aug. 21, 2003 are incorporated herein by reference.

Although the invention has been described above by reference to certain embodiments and examples of the invention, the invention is not limited to the embodiments and examples described above. Modifications and variations of the embodiments and examples described above will occur to those skilled in the art, in light of the above teachings. The scope of the invention is defined with reference to the following claims.

What is claimed is:

1. A low-friction sliding member comprising:
   a base material having a surface; and
   a hard carbon thin film formed on at least a part of the surface of the base material the hard carbon thin film being formed of diamond-like carbon containing hydrogen in an amount not more than 10 atomic %;
   wherein a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound capable of forming the tribo-film having at least one functional group selected from the group consisting of ether linkage, oxido and hydroxyl group, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

2. A low-friction sliding member as claimed in claim 1, wherein the tribo-film has a thickness of not more than 10 nm.

3. A low-friction sliding member as claimed in claim 1, wherein the tribo-film has a lower friction characteristics than a tribo-film which does not have at least one functional group selected from the group consisting of ether linkage, oxido and hydroxyl group.

4. A low-friction sliding member as claimed in claim 1, wherein the hard carbon thin film is formed of diamond-like carbon of a-C type containing substantially no hydrogen.

5. A low-friction sliding member as claimed in claim 1, wherein the hard carbon thin film has a surface roughness (Ra) not more than 0.1 μm.

6. A low-friction sliding member as claimed in claim 1, wherein the hard carbon thin film has a surface hardness (Hv) ranging from 1000 to 3500 in micro-Vickers hardness (under a load of 10 g), and a film thickness ranging from 0.3 to 2.0 μm.

7. A low-friction sliding member as claimed in claim 2, wherein the tribo-film is formed within a range from a sliding surface of the sliding member to a depth of 10 nm from the sliding surface during friction between the hard carbon thin film and the opposite member, the sliding surface of the sliding member being in sliding contact with the opposite member.

8. A low-friction sliding mechanism comprising:
a first low-friction sliding member including a base material having a surface, and a hard carbon thin film formed on at least a part of the surface of the base material the hard carbon thin film being formed of diamond-like carbon containing hydrogen in an amount not more than 10 atomic %, wherein a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound;
at least one of a second low-friction sliding member and a metal member having a sliding surface, serving as the opposite member, the second low-friction sliding member including a base material having a surface of the base material, and a hard carbon thin film formed on at least a part of the surface the hard carbon thin film being formed of diamond-like carbon containing hydrogen in an amount not more than 10 atomic %, wherein a tribo-film having at least one functional group selected from the group consisting of ether linkage, oxido and hydroxyl group is formed on the hard carbon thin film when the hard carbon thin film is in slidable contact with the opposite member in presence of the organic oxygen-containing compound; and
the organic oxygen-containing compound present in a sliding surface site formed between a sliding surface of the first low-friction sliding member and the sliding surface of at least one of the second low-friction sliding member and the metal member, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

9. A low-friction sliding mechanism comprising:
a first low-friction sliding member including a base material having a surface, and a hard carbon thin film formed on at least a part of the surface of the base material the hard carbon thin film being formed of diamond-like carbon containing hydrogen in an amount not more than 10 atomic %, wherein a tribo-film having at least one functional group selected from the group consisting of ether linkage, oxido and hydroxyl group is formed on the hard carbon thin film when the hard carbon thin film is in slidable contact with an opposite member in presence of an organic oxygen-containing compound;
at least one of a second low-friction sliding member and a metal member having a sliding surface, serving as the opposite member, the second low-friction sliding member including a base material having a surface of the base material, and a hard carbon thin film formed on at least a part of the sliding surface the hard carbon thin film being formed of diamond-like carbon containing hydrogen in an amount not more than 10 atomic %, wherein a tribo-film having at least one functional group selected from the group consisting of ether linkage, oxido and hydroxyl group is formed on the hard carbon thin film when the hard carbon thin film is in slidable contact with the opposite member in presence of the organic oxygen-containing compound; and
lubricating oil present in a sliding surface site formed between a sliding surface of the first low-friction sliding member and the sliding surface of at least one of the second low-friction sliding member and the metal member, the lubricating oil containing the organic oxygen-containing compound, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

10. A process for reducing friction of a sliding member including a base material having a surface, the process comprising:
forming a hard carbon thin film on at least a part of the surface of the base material the hard carbon thin film being formed of diamond-like carbon containing hydrogen in an amount not more than 10 atomic %; and
forming a tribo-film having at least one functional group selected from the group consisting of ether linkage, oxido and hydroxyl group on the hard carbon thin film when the hard carbon thin film is in slidable contact with an opposite member in presence of an organic oxygen-containing compound, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

11. A low-friction sliding mechanism, comprising:
a first sliding member having a sliding surface, at least the sliding surface of the first sliding member comprising a diamond-like carbon material containing hydrogen in an amount not more than 10 atomic % and;
a second sliding member having a sliding surface slidable relative to the sliding surface of the first sliding member; and a lubricant applied to the sliding surfaces of the first and second sliding members, the lubricant comprising an oxygen-containing organic compound or a nitrogen-containing organic compound, wherein the oxygen-containing organic compound is at least one selected from the group consisting of at alcohol, carboxylic acid, ester, ether, ketone, aldehyde, carbonate, and derivative of the alcohol, the carboxylic acid, the ester, the ether, the ketone, the aldehyde and the carbonate.

12. A low-friction sliding mechanism, comprising:
a first sliding member having a sliding surface, at least the sliding surface of the first sliding member comprising a diamond-like carbon material containing hydrogen in an amount not more than 10 atomic % and;

a second sliding member having a sliding surface slidable relative to the sliding surface of the first sliding member, at least the sliding surface of the second sliding member comprising a diamond-like carbon material containing hydrogen in an amount not more than 10 atomic %; and a lubricant applied to the sliding surfaces of the first and second sliding members, the lubricant comprising glycerin.

13. A low-friction sliding member comprising:

a base material having a surface; and a hard carbon thin film formed on at least a part of the surface of the base material, the hard carbon thin film being formed of diamond-like carbon containing hydrogen in an amount not more than 10 atomic %;

wherein a tribo-film having at least one functional group selected from the group consisting of either linkage, oxide and hydroxyl group is formed on the hard carbon thin film when the hard carbon thin film is in slidable contact with an opposite member in presence of an organic oxygen-containing compound containing at least one functional group selected from the group consisting of ether linkage, oxido and hydroxyl group, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

14. A low-friction sliding mechanism comprising:

a first sliding member including a base material having a surface;

a second sliding member including a base member having a surface, the second sliding member being in slidable contact with the first sliding member, wherein at least a part of the surface of the base member of one of the first and second sliding members is coated with a hard carbon thin film; and an organic oxygen-containing compound present between the first and second sliding members and capable of forming a tribo-film having at least one functional group selected from the group consisting of ether linkage, oxide and hydroxyl group, on the hard carbon thin film when the first and second sliding members are in slidable contact with each other in presence of the organic oxygen-containing compound, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

15. A low-friction sliding mechanism comprising:

a first sliding member including a base material having a surface;

a second sliding member including a base member having a surface, the second sliding member being in slidable contact with the first sliding member;

a first film of a-C type diamond-like carbon formed on at least a part of the surface of the base material of the first sliding member;

a second film of a-C type diamond-like carbon formed on at least a part of the surface of the base material of the second sliding member; and an organic oxygen-containing compound present between the first and second sliding members and capable of forming a tribo-film having at least one functional group selected from the group consisting of ether linkage, oxido and hydroxyl group, on the first and second films when the first and second sliding members are in slidable contact with each other in presence of the organic oxygen-containing compound, wherein the organic oxygen-containing compound is at least one selected from the group consisting of an alcohol, carboxylic acid, ester, ether, ketone, aldehyde, carbonate, and a derivative of the alcohol, the carboxylic acid, the ester, the ether, the ketone, the aldehyde and the carbonate.

* * * * *

UNITED STATES PATENT AND TRADEMARK OFFICE
CERTIFICATE OF CORRECTION

| | |
|---|---|
| PATENT NO. | : 7,771,821 B2 |
| APPLICATION NO. | : 10/911744 |
| DATED | : August 10, 2010 |
| INVENTOR(S) | : Jean Michel Martin et al. |

It is certified that error appears in the above-identified patent and that said Letters Patent is hereby corrected as shown below:

On the Title page, at Item (73) Assignee, after "Nissan Motor Co., Ltd., Yokohama-shi (JP)" please insert -- Nissan Arc Co. Ltd. Yokosuka-shi (JP) and Jean Michel Martin, Chazay d'Azergues (FR) --.

Signed and Sealed this

Thirtieth Day of November, 2010

David J. Kappos
*Director of the United States Patent and Trademark Office*